(12) United States Patent  
Liao

(10) Patent No.: US 11,367,676 B2  
(45) Date of Patent: Jun. 21, 2022

(54) SEMICONDUCTOR DEVICE PACKAGES INCLUDING REDISTRIBUTION LAYER AND METHOD FOR MANUFACTURING THE SAME

(71) Applicant: Advanced Semiconductor Engineering, Inc., Kaohsiung (TW)

(72) Inventor: Shun Sing Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 56 days.

(21) Appl. No.: 16/569,234

(22) Filed: Sep. 12, 2019

(65) Prior Publication Data

US 2021/0082795 A1 Mar. 18, 2021

(51) Int. Cl.
*H01L 23/49* (2006.01)
*H01L 23/498* (2006.01)
*H01L 21/48* (2006.01)
*H01L 23/31* (2006.01)

(52) U.S. Cl.
CPC .... *H01L 23/49805* (2013.01); *H01L 21/4846* (2013.01); *H01L 23/3121* (2013.01); *H01L 23/49838* (2013.01)

(58) Field of Classification Search
CPC ........... H01L 23/49805; H01L 21/4846; H01L 23/3121; H01L 23/49838; H01L 24/05; H01L 24/13; H01L 24/04; H01L 24/11; H01L 24/73; H01L 27/14643; H01L 27/14687; H01L 27/14689; H01L 27/14618; H01L 27/14636; H01L 27/14685
USPC .......................................... 257/668; 438/123
See application file for complete search history.

(56) References Cited

U.S. PATENT DOCUMENTS

| 5,866,952 A * | 2/1999 | Wojnarowski ........ H01L 21/568 257/788 |
| 2015/0137350 A1* | 5/2015 | Huang .................... H01L 24/05 257/737 |
| 2016/0086960 A1* | 3/2016 | Wen ..................... H01L 21/0217 257/295 |
| 2016/0141219 A1* | 5/2016 | Liu ................... H01L 21/02263 257/737 |

FOREIGN PATENT DOCUMENTS

JP 2005-166931 A 6/2005

* cited by examiner

*Primary Examiner* — Didarul A Mazumder
(74) *Attorney, Agent, or Firm* — Foley & Lardner LLP

(57) ABSTRACT

A semiconductor device package includes a substrate, a semiconductor device and an encapsulant. The substrate includes a passivation layer, a first conductive layer and a barrier layer. The passivation layer has a substantially vertical sidewall. The first conductive layer is disposed on the passivation layer. The barrier layer is disposed on the passivation layer and the first conductive layer. The barrier layer includes a substantially slant sidewall.

18 Claims, 40 Drawing Sheets

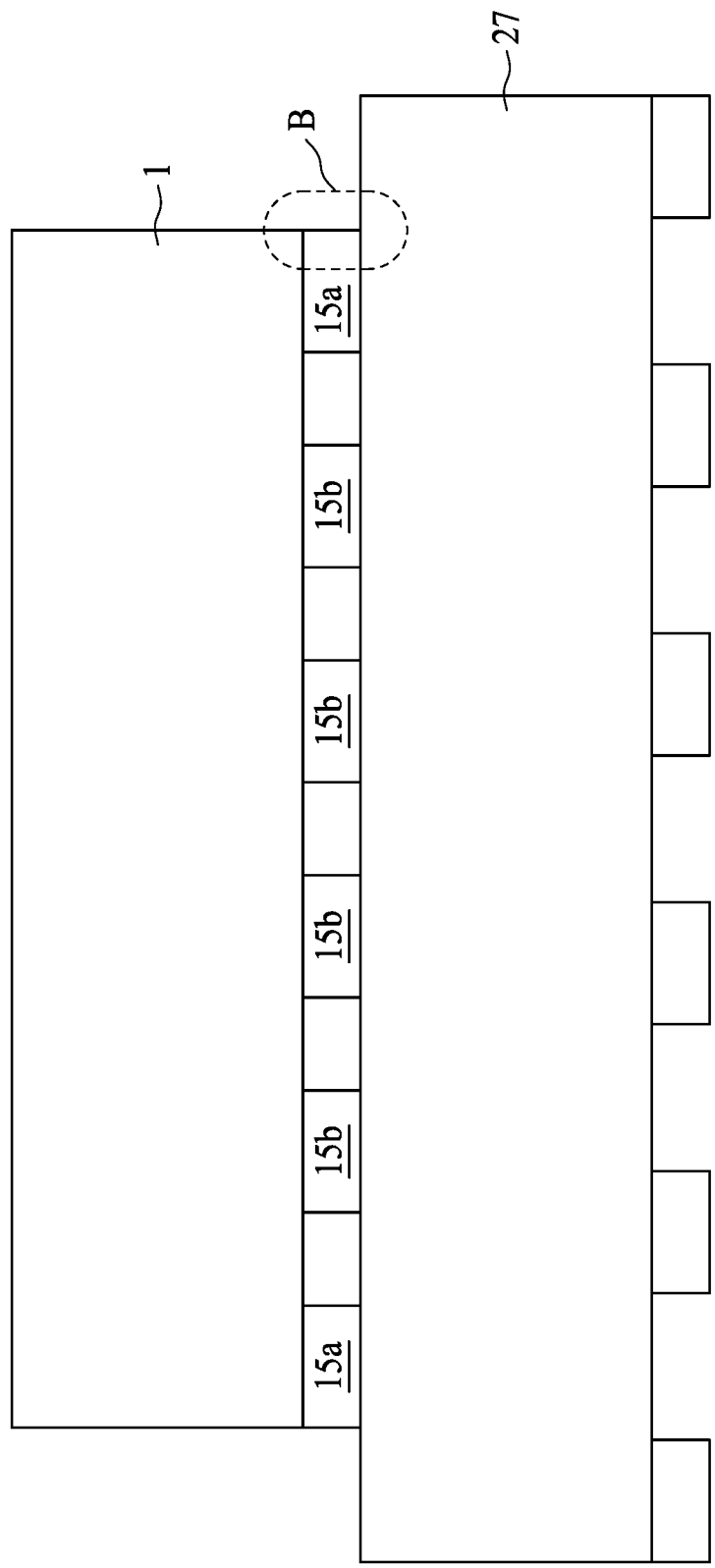

SEMICONDUCTOR DEVICE PACKAGES INCLUDING REDISTRIBUTION LAYER AND METHOD FOR MANUFACTURING THE SAME

BACKGROUND

1. Field of the Disclosure

The present disclosure relates to semiconductor device packages, and more particular to semiconductor device packages and methods thereof manufacturing the same.

2. Description of the Related Art

A semiconductor device package may include some connection elements, e.g. conductive pads, bumps or lands, for external connection. The semiconductor device package can be mounted or assembled to a print circuit board (PCB) or a system board by solder material. Reliability of the bonding of the semiconductor device package to the PCB may be determined by degree of soldering of the connection elements of the semiconductor device package. Relatively poor soldering degree on the connection elements may adversely affect performance or reliability to the assembly.

SUMMARY

In some embodiments, the present disclosure discloses a semiconductor device package. The semiconductor device package includes a substrate, a semiconductor device and an encapsulant. The substrate includes a passivation layer, a first conductive layer and a barrier layer. The passivation layer has a substantially vertical sidewall. The first conductive layer is disposed on the passivation layer. The barrier layer is disposed on the passivation layer and the first conductive layer. The barrier layer includes a substantially slant sidewall.

In some embodiments, the present disclosure discloses a semiconductor device package. The semiconductor device package includes a substrate, a semiconductor device and an encapsulant. The substrate includes a passivation layer, a first conductive layer, a second conductive layer and a barrier layer. The passivation layer has a substantially vertical sidewall. The first conductive layer is disposed on the passivation layer. The second conductive layer is disposed on the first conductive layer. The barrier layer is disposed on the second conductive layer and in direct contact with the first conductive layer.

In some embodiments, the present disclosure discloses a substrate. The substrate includes a barrier layer having a substantially horizontal sidewall and a substantially slant sidewall.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 2A illustrates an assembly including a semiconductor device package mounted on a substrate.

FIG. 3A, FIG. 3B, FIG. 3C, FIG. 3D, FIG. 3E, FIG. 3F, FIG. 3J, FIG. 3K and FIG. 3L illustrate a method of manufacturing a semiconductor device package as shown in FIG. 3'.

DETAILED DESCRIPTION

Figure 1:
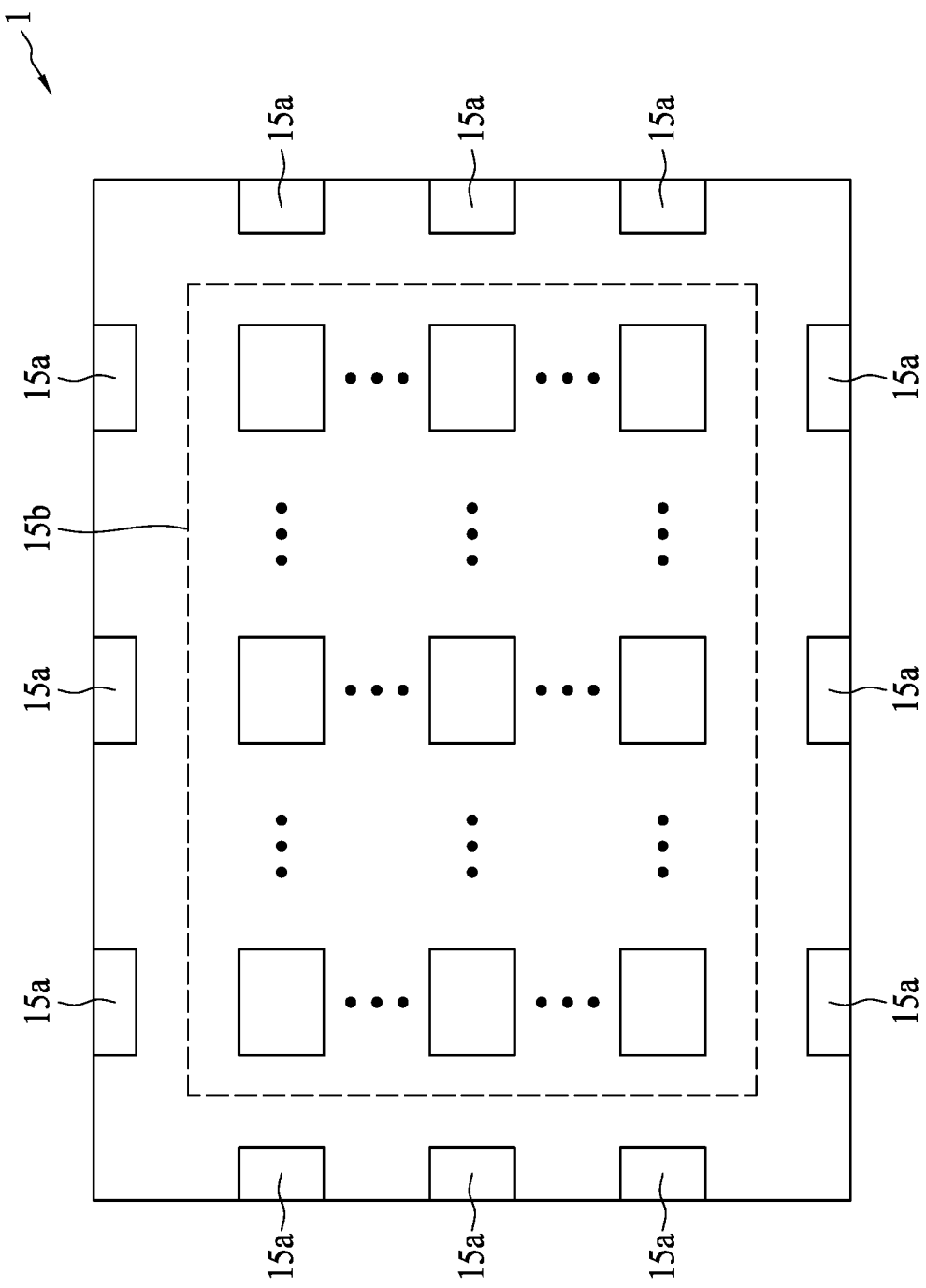
FIG. 1 illustrates a bottom view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is relatively low, the manufacturing yield for the circuit layers and the dielectric layers of such core substrate is also relatively low, and, thus, the yield of such core substrate is relatively low.

At least some embodiments of the present disclosure provide for a wiring structure which has an advantageous compromise of yield and manufacturing cost. At least some embodiments of the present disclosure further provide for techniques for manufacturing the wiring structure.

FIG. 1 illustrates a bottom view of a semiconductor device package. Connection elements 15a and 15b are disposed on the substrate. The connection elements 15a surround the periphery of the substrate. The connection elements 15b are disposed in the inner portion of the substrate. FIG. 1 illustrates that the connection elements 15a are at the relatively periphery portion of the semiconductor device package 1. FIG. 1B illustrates the connection elements 15a are around the edge portions of the semiconductor device package 1.

Figure 1A:
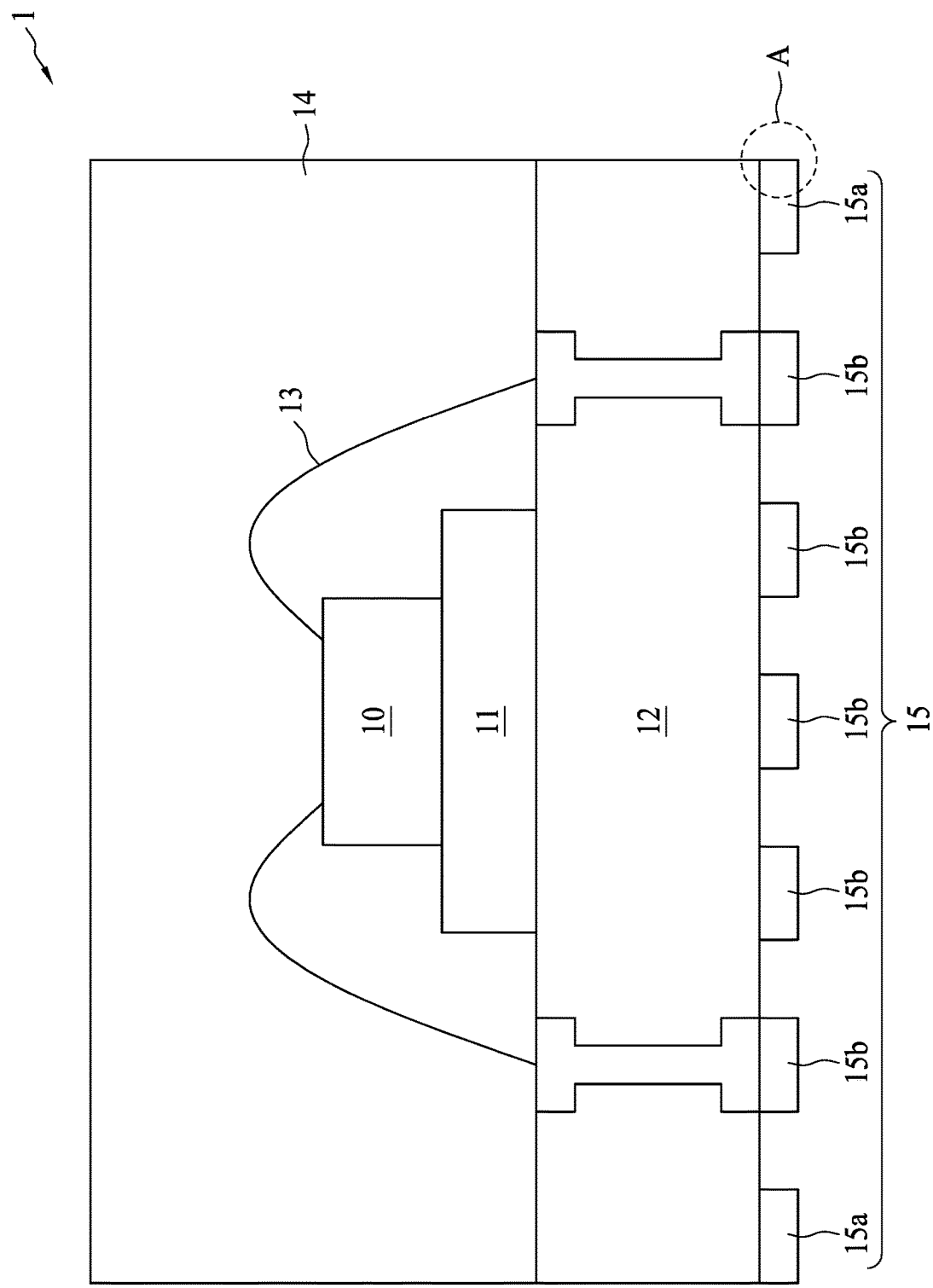
FIG. 1A illustrates a cross-sectional view of a semiconductor device package according to some embodiments of the present disclosure.
Figure 1B:
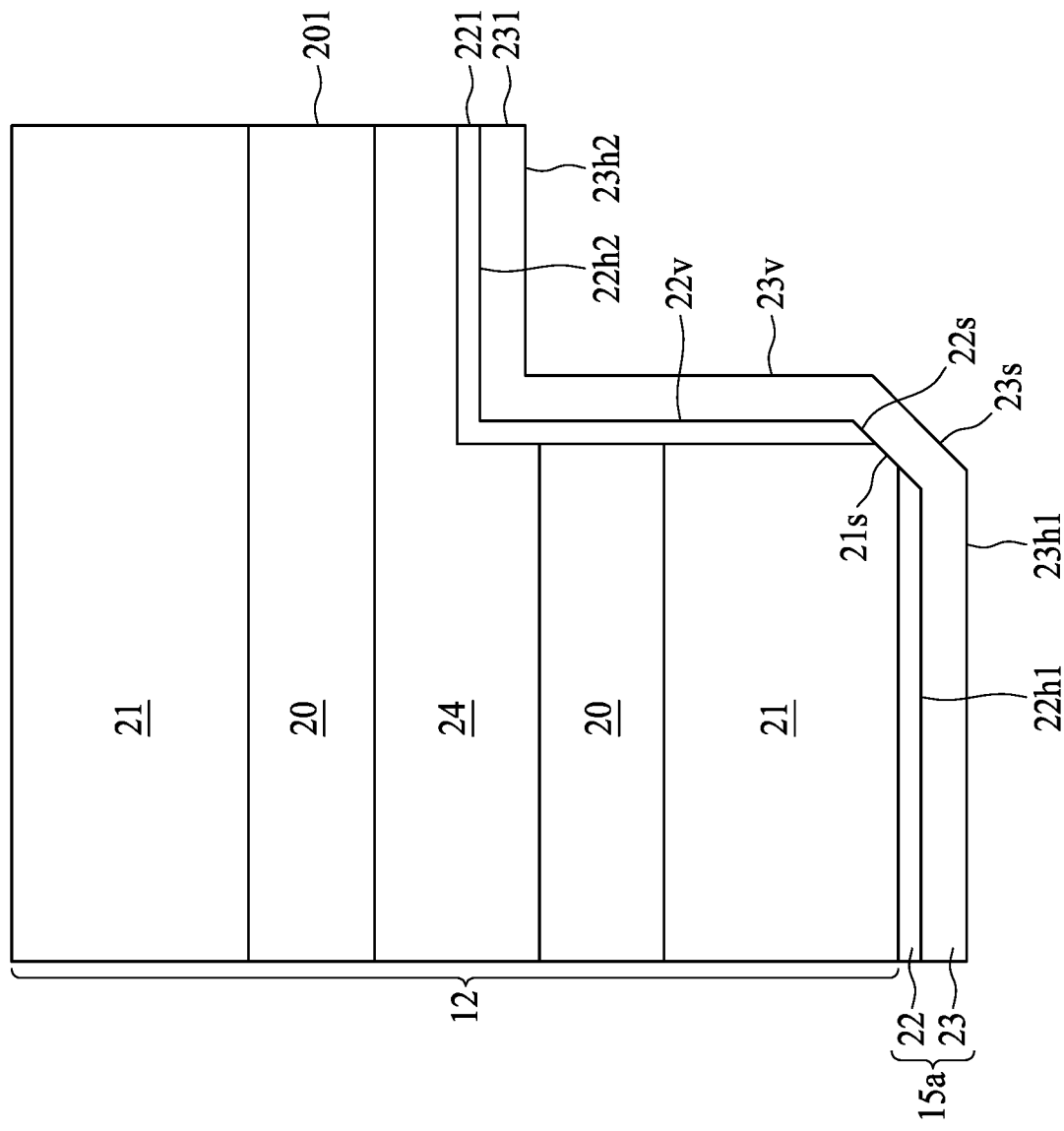
FIG. 1B illustrates an enlarged view of a structure in the dotted circle A as shown in FIG. 1A.

FIG. 1A illustrates a cross-sectional view of a semiconductor device package 1 according to some embodiments of the present disclosure. A semiconductor device 10 is disposed on another semiconductor device 11. The semiconductor device 11 is disposed on a redistribution layer (RDL) 12. The semiconductor device 10 is electrically connected to the RDL 12 via wires 13. An encapsulant 14 is disposed on the substrate. The encapsulant 14 encapsulates the semiconductor devices 10 and 11. Connection elements 15 are formed below the RDL 12. The connection element 15 includes the connection elements 15a and 15b.

FIG. 1B illustrates an enlarged view of a structure in the dotted circle A as shown in FIG. 1A. FIG. 1B illustrates the RDL 12 and the connection elements 15a at the outmost side of the semiconductor device package 1 at the outmost side of the substrate. FIG. 1B illustrates the RDL 12 and the connection elements 15a at the relatively periphery portions of the semiconductor device package 1. FIG. 1B illustrates the RDL 12 and the connection elements 15a around the edge portions of the semiconductor device package 1. A passivation layer 20 is provided. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially vertical sidewall 22v. The conductive layer 22 has a substantially horizontal sidewall 22h1. The conductive layer 22 has another substantially horizontal sidewall 22h2. The substantially slant sidewall 22s is connected to the substantially horizontal sidewall 22h1. The substantially slant sidewall 22s is connected to the substantially vertical sidewall 22v. The substantially vertical sidewall 22v is connected to the substantially horizontal sidewall 22h2. The substantially horizontal sidewall 22h2 has a lateral surface 221.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21. The barrier layer 23 is formed by electroless plating. The substantially horizontal sidewall 23h2 has a lateral surface 231. The lateral surface 221 is coplanar with the lateral surface 231.

The barrier layer 23 has a substantially slant sidewall 23s. The barrier layer 23 has a substantially vertical sidewall 23v. The barrier layer 23 has a substantially horizontal sidewall 23h1. The barrier layer 23 has another substantially horizontal sidewall 23h2. The substantially slant sidewall 23s is connected to the substantially horizontal sidewall 23h1. The substantially slant sidewall 23s is connected to the substantially vertical sidewall 23v. The substantially vertical sidewall 23v is connected to the substantially horizontal sidewall 23h2.

The conductive layer 22 does not continuously surround the conductive layer 21. The conductive layer 22 has two portions that are separated from each other. The conductive layer 21 has a substantially slant sidewall 21s. The barrier layer 23 is in direct contact with the conductive layer 21. A portion of the barrier layer 23 is in direct contact with the substantially slant sidewall 21s.

The adhesion between the conductive layer 21 and the barrier layer 23 is better than the adhesion between the conductive layer 22 and the passivation layer 20. Since the adhesion between the conductive layer 22 and the passivation layer 20 is worse, peeling may occur at the interface between the conductive layer 22 and the passivation layer 20. This causes less barrier layer 23 formed adjacent to the passivation layer 20. Therefore, a thickness of the barrier layer 23 on the substantially slant sidewall 21s can be greater than a thickness of the barrier layer 23 of the substantially vertical sidewall 23v.

A core layer 24 is disposed on the passivation layer 20. The conductive layer 22 extends into the core layer 24. Another passivation layer 20 is disposed on the core layer 24. The passivation layer 20 has a lateral surface 201. The lateral surface 201 is coplanar with the lateral surface 221 and the lateral surface 231. The lateral surface 201, the lateral surface 221 and the lateral surface 231 are at the outmost side of the substrate. Another conductive layer 21 is disposed on the passivation layer 20.

Figure 1C:
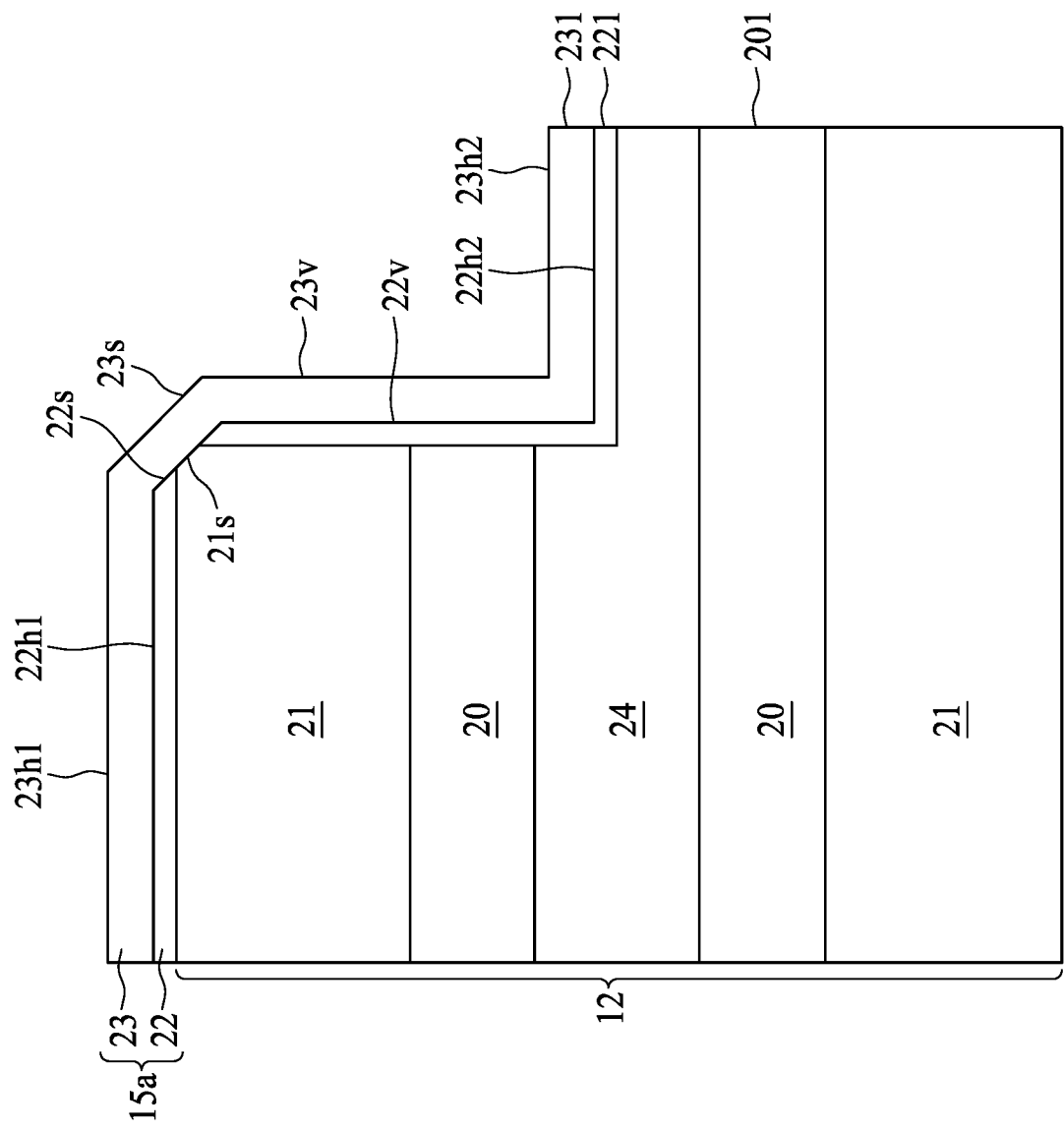
FIG. 1C illustrates an upside down view of FIG. 1B.

FIG. 1C illustrates an upside down view of FIG. 1B. FIG. 1C illustrates the RDL 12 and the connection element 15a at the outmost side of the semiconductor device package 1 at the outmost side of the substrate. FIG. 1C illustrates the RDL 12 and the connection elements 15a at the relatively periphery portions of the semiconductor device package 1. FIG. 1C illustrates the RDL 12 and the connection elements 15a around the edge portions of the semiconductor device package 1. A conductive layer 21 is provided. A passivation layer 20 is disposed on the conductive layer 21. A core layer 24 is disposed on the passivation layer 20. Passivation layer 20 is disposed on the core layer 24. Conductive layer 21 is disposed on the passivation layer 20. A conductive layer 22 is disposed on the conductive layer 21. A barrier layer 23 is disposed on the conductive layer 22. The conductive layer 22 is disposed between the conductive layer 21 and the barrier layer 23. The conductive layer 22 extends into the core layer 24.

The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially vertical sidewall 22v. The conductive layer 22 has a substantially horizontal sidewall 22h1. The conductive layer 22 has another substantially horizontal sidewall 22h2. The substantially slant sidewall 22s is connected to the substantially horizontal sidewall 22h1. The substantially slant sidewall 22s is connected to the substantially vertical sidewall 22v. The substantially vertical sidewall 22v is connected to the substantially horizontal sidewall 22h2. The substantially horizontal sidewall 22h2 has a lateral surface 221.

The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed on the conductive layer 21. The barrier layer 23 is formed by electroless plating. The substantially horizontal sidewall 23h2 has a lateral surface 231. The lateral surface 221 is coplanar with the lateral surface 231.

The barrier layer 23 has a substantially slant sidewall 23s. The barrier layer 23 has a substantially vertical sidewall 23v. The barrier layer 23 has a substantially horizontal sidewall 23h1. The barrier layer 23 has another substantially horizontal sidewall 23h2. The substantially slant sidewall 23s is connected to the substantially horizontal sidewall 23h1. The substantially slant sidewall 23s is connected to the substantially vertical sidewall 23v. The substantially vertical sidewall 23v is connected to the substantially horizontal sidewall 23h2.

The conductive layer 22 does not continuously surround the conductive layer 21. The conductive layer 22 has two portions that are separated from each other. The conductive layer 21 has a substantially slant sidewall 21s. The barrier layer 23 is in direct contact with the conductive layer 21.

The adhesion between the conductive layer 21 and the barrier layer 23 is better than the adhesion between the conductive layer 22 and the passivation layer 20. Since the adhesion between the conductive layer 22 and the passivation layer 20 is worse, peeling may occur at the interface between the conductive layer 22 and the passivation layer 20. This causes less barrier layer 23 formed adjacent to the passivation layer 20. Therefore, a thickness of the barrier layer 23 on the substantially slant sidewall 21s can be greater than a thickness of the barrier layer 23 of the substantially vertical sidewall 23v.

A core layer 24 is disposed on the passivation layer 20. The conductive layer 22 extends into the core layer 24. Another passivation layer 20 is disposed on the core layer 24. The passivation layer 20 has a lateral surface 201. The lateral surface 201 is coplanar with the lateral surface 221 and the lateral surface 231. The lateral surface 201, the lateral surface 221 and the lateral surface 231 are at the outmost side of the substrate. Another conductive layer 21 is disposed on the passivation layer 20

Figure 1D:
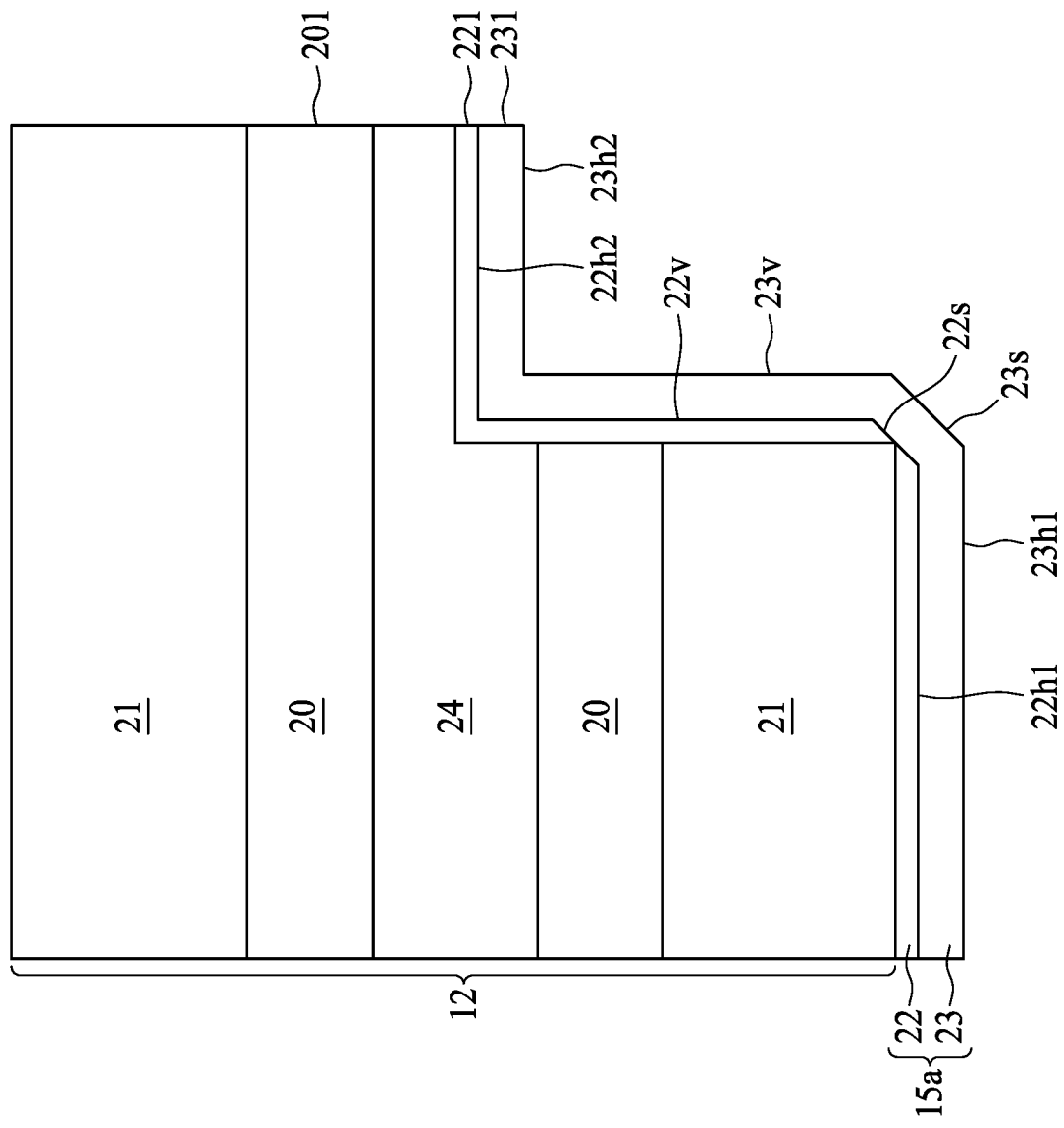
FIG. 1D illustrates an enlarged view of a structure in the dotted circle A as shown in FIG. 1A.

FIG. 1D illustrates an enlarged view of a structure in the dotted circle A as shown in FIG. 1A. FIG. 1D illustrates the RDL 12 and the connection element 15a at the outmost side of the semiconductor device package 1 at the outmost side of the substrate. FIG. 1D illustrates the RDL 12 and the connection elements 15a at the relatively periphery portions of the semiconductor device package 1. FIG. 1D illustrates the RDL 12 and the connection elements 15a around the edge portions of the semiconductor device package 1. A passivation layer 20 is provided. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially vertical sidewall 22v. The conductive layer 22 has a substantially horizontal sidewall 22h1. The conductive layer 22 has another substantially horizontal sidewall 22h2. The substantially slant sidewall 22s is connected to the substantially horizontal sidewall 22h1. The substantially slant sidewall 22s is connected to the substantially vertical sidewall 22v. The substantially vertical sidewall 22v is connected to the substantially horizontal sidewall 22h2. The substantially horizontal sidewall 22h2 has a lateral surface 221. A vertex of the conductive layer 21 is in contact with substantially slant sidewall 22s of the conductive layer 22.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21. The barrier layer 23 is formed by electroless plating. The substantially horizontal sidewall 23h2 has a lateral surface 231. The lateral surface 221 is coplanar with the lateral surface 231.

The barrier layer 23 has a substantially slant sidewall 23s. The barrier layer 23 has a substantially vertical sidewall 23v. The barrier layer 23 has a substantially horizontal sidewall 23h1. The barrier layer 23 has another substantially horizontal sidewall 23h2. The substantially slant sidewall 23s is connected to the substantially horizontal sidewall 23h1. The substantially slant sidewall 23s is connected to the substantially vertical sidewall 23v. The substantially vertical sidewall 23v is connected to the substantially horizontal sidewall 23h2. A vertex of the conductive layer 21 is in contact with the substantially slant sidewall 22s.

The adhesion between the conductive layer 21 and the barrier layer 23 is better than the adhesion between the conductive layer 22 and the passivation layer 20. Since the adhesion between the conductive layer 22 and the passivation layer 20 is worse, peeling may occur at the interface between the conductive layer 22 and the passivation layer 20. This causes less barrier layer 23 formed adjacent to the passivation layer 20. Therefore, a thickness of the barrier layer 23 on the substantially slant sidewall 21s can be greater than a thickness of the barrier layer 23 of the substantially vertical sidewall 23v.

A core layer 24 is disposed on the passivation layer 20. The conductive layer 22 extends into the core layer 24. Another passivation layer 20 is disposed on the core layer 24. The passivation layer 20 has a lateral surface 201. The substantially vertical surface 201 is coplanar with the lateral surface 221 and the lateral surface 231. The lateral surface 201, the lateral surface 221 and the lateral surface 231 are at the outmost side of the substrate. Another conductive layer 21 is disposed on the passivation layer 20.

Figure 1E:
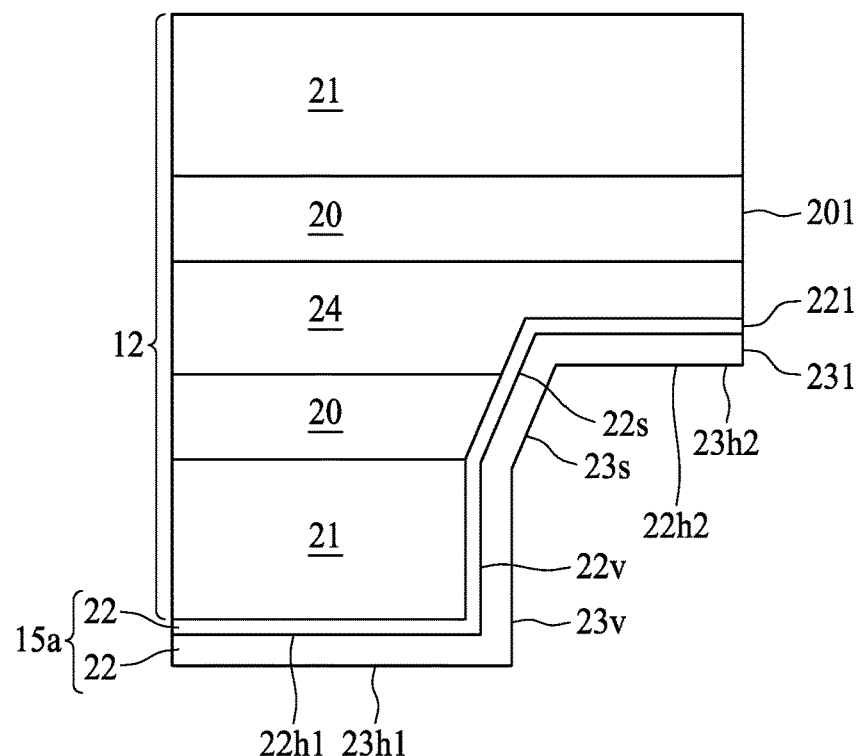
FIG. 1E illustrates an enlarged view of a structure in the dotted circle A as shown in FIG. 1A.

FIG. 1E illustrates an enlarged view of a structure in the dotted circle A as shown in FIG. 1A. FIG. 1E illustrates the RDL 12 and the connection element 15a at the outmost side of the semiconductor device package 1 at the outmost side of the substrate. FIG. 1E illustrates the RDL 12 and the connection elements 15a at the relatively periphery portions of the semiconductor device package 1. FIG. 1E illustrates the RDL 12 and the connection elements 15a around the edge portions of the semiconductor device package 1. A passivation layer 20 is provided. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially vertical sidewall 22v. The conductive layer 22 has a substantially horizontal sidewall 22h1. The conductive layer 22 has another substantially horizontal sidewall 22h2. The substantially vertical sidewall 22v is connected to the substantially horizontal sidewall 22h1. The substantially vertical sidewall 22v is connected to the substantially slant sidewall 22s. The substantially slant sidewall 22s is connected to the substantially horizontal sidewall 22h2. The substantially horizontal sidewall 22h2 has a lateral surface 221.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21.

The barrier layer 23 has a substantially slant sidewall 23s. The barrier layer 23 has a substantially vertical sidewall 23v. The barrier layer 23 has a substantially horizontal sidewall 23h1. The barrier layer 23 has another substantially horizontal sidewall 23h2. The substantially vertical sidewall 23v is connected to the substantially horizontal sidewall 23h1. The substantially vertical sidewall 23v is connected to the substantially slant sidewall 23s. The substantially slant sidewall 23s is connected to the substantially horizontal sidewall 23h2. The barrier layer 23 is formed by electroless plating. The substantially horizontal sidewall 23h2 has a lateral surface 231. The lateral surface 221 is coplanar with the lateral surface 231.

A core layer 24 is disposed on the passivation layer 20. The conductive layer 22 extends into the core layer 24. Another passivation layer 20 is disposed on the core layer 24. The passivation layer 20 has a lateral surface 201. The lateral surface 201 is coplanar with the lateral surface 221 and the lateral surface 231. The lateral surface 201, the lateral surface 221 and the lateral surface 231 are at the outmost side of the substrate. Another conductive layer 21 is disposed on the passivation layer 20.

Figure 1F:
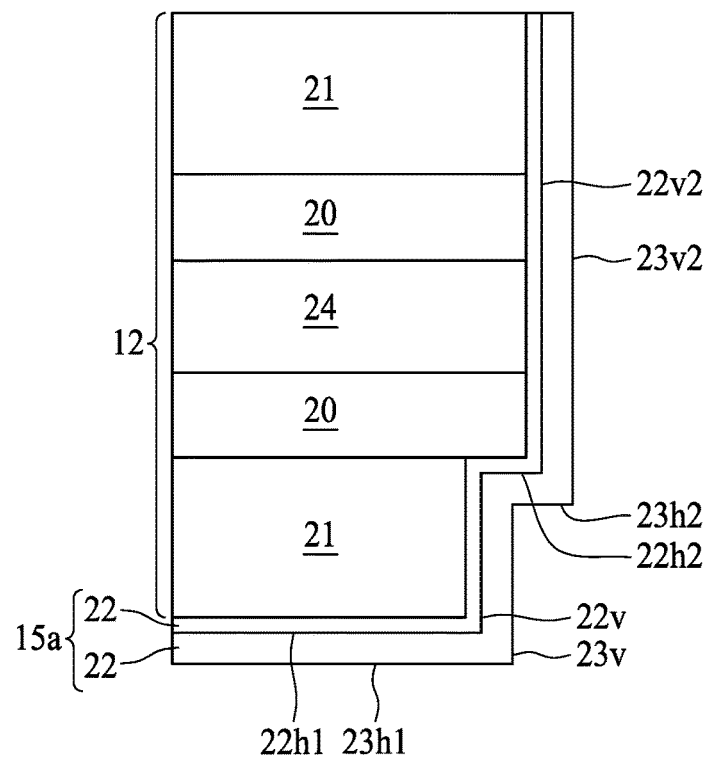
FIG. 1F illustrates an enlarged view of a structure in the dotted circle A as shown in FIG. 1A.

FIG. 1F illustrates an enlarged view of a structure in the dotted circle A as shown in FIG. 1A. FIG. 1F illustrates the RDL 12 and the connection element 15a at the outmost side of the semiconductor device package 1 at the outmost side of the substrate. FIG. 1F illustrates the RDL 12 and the connection elements 15a at the relatively periphery portions of the semiconductor device package 1. FIG. 1F illustrates the RDL 12 and the connection elements 15a around the edge portions of the semiconductor device package 1. A passivation layer 20 is provided. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially vertical sidewall 22v1. The conductive layer 22 has another substantially vertical sidewall 22v2. The conductive layer 22 has a substantially horizontal sidewall 22h1. The conductive layer 22 has another substantially horizontal sidewall 22h2. The substantially vertical sidewall 22v1 is connected to the substantially horizontal sidewall 22h1. The substantially vertical sidewall 22v1 is connected to the substantially horizontal sidewall 22h2. The substantially vertical sidewall 22v2 is connected to the substantially horizontal sidewall 22h2.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21. The barrier layer 23 is formed by electroless plating.

The barrier layer 23 has a substantially vertical sidewall 23v1. The barrier layer 23 has another substantially vertical sidewall 23v2. The barrier layer 23 has a substantially horizontal sidewall 23h1. The barrier layer 23 has another substantially horizontal sidewall 23h2. The substantially vertical sidewall 23v1 is connected to the substantially horizontal sidewall 23h1. The substantially vertical sidewall 23v1 is connected to the substantially horizontal sidewall 23h2. The substantially vertical sidewall 23v2 is connected to the substantially horizontal sidewall 23h2.

A core layer 24 is disposed on the passivation layer 20. The conductive layer 22 extends into the core layer 24. Another passivation layer 20 is disposed on the core layer 24. Another conductive layer 21 is disposed on the passivation layer 20.

Figure 1G:
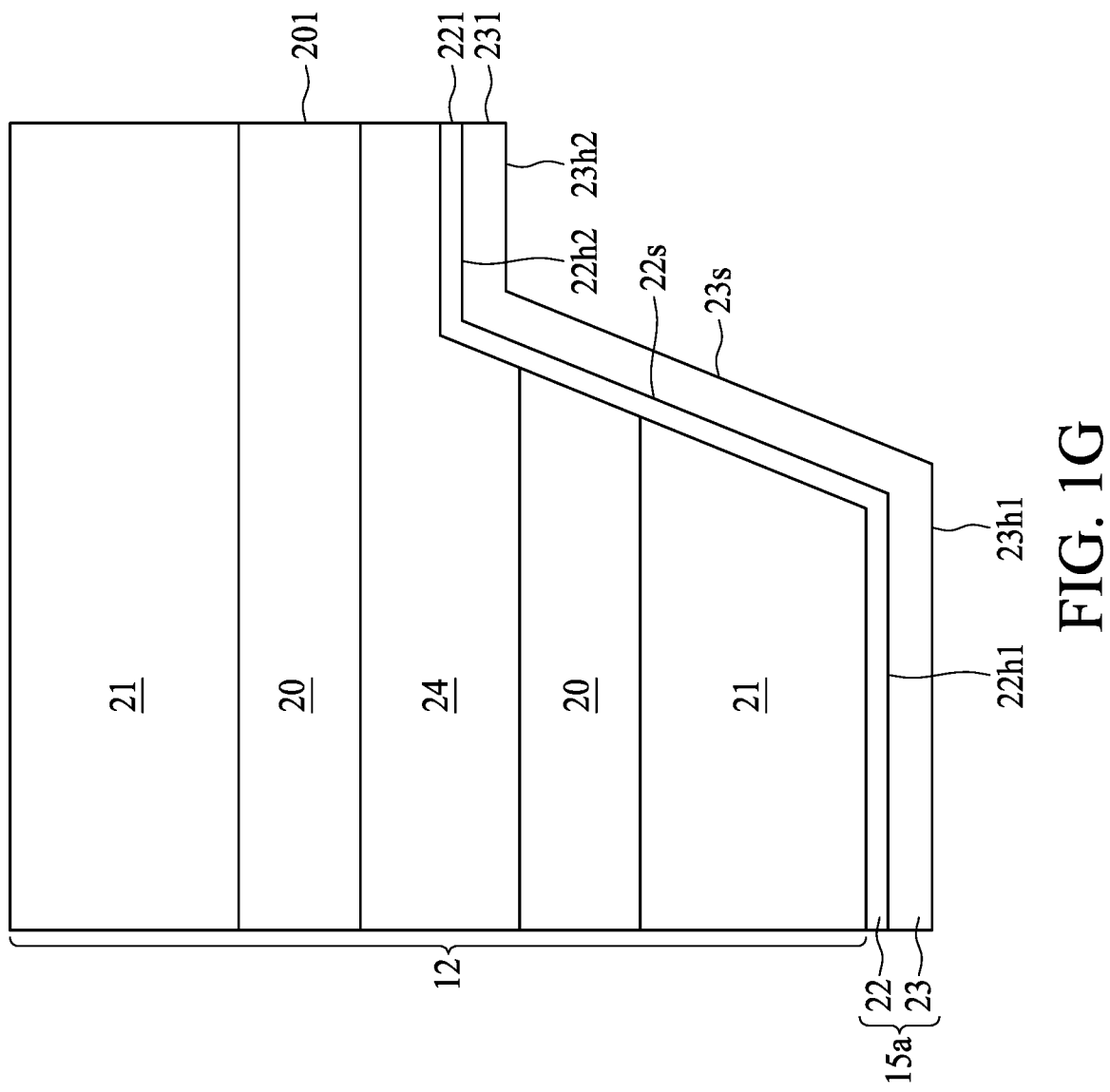
FIG. 1G illustrates an enlarged view of a structure in the dotted circle A as shown in FIG. 1A.

FIG. 1G illustrates an enlarged view of a structure in the dotted circle A as shown in FIG. 1A. FIG. 1F illustrates the RDL 12 and the connection element 15a at the outmost side of the semiconductor device package 1 at the outmost side of the substrate. FIG. 1G illustrates the RDL 12 and the connection elements 15a at the relatively periphery portions of the semiconductor device package 1. FIG. 1G illustrates the RDL 12 and the connection elements 15a around the edge portions of the semiconductor device package 1. A passivation layer 20 is provided. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially horizontal sidewall 22h1. The conductive layer 22 has another substantially horizontal sidewall 22h2. The substantially slant sidewall 22s is connected to the substantially horizontal sidewall 22h1. The substantially slant sidewall 22s is connected to the substantially horizontal sidewall 22h2. The substantially horizontal sidewall 22h2 has a lateral surface 221.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21. The barrier layer 23 is formed by electroless plating.

The barrier layer 23 has a substantially slant sidewall 23s. The barrier layer 23 has a substantially horizontal sidewall 23h1. The barrier layer 23 has another substantially horizontal sidewall 23h2. The substantially slant sidewall 23s is connected to the substantially horizontal sidewall 23h1. The substantially slant sidewall 23s is connected to the substantially horizontal sidewall 23h2. The substantially horizontal sidewall 23h2 has a lateral surface 231. The lateral surface 221 is coplanar with the lateral surface 231.

A core layer 24 is disposed on the passivation layer 20. The conductive layer 22 extends into the core layer 24. Another passivation layer 20 is disposed on the core layer 24. The passivation layer 20 has a lateral surface 201. The lateral surface 201 is coplanar with the lateral surface 221 and the lateral surface 231. The lateral surface 201, the lateral surface 221 and the lateral surface 231 are at the outmost side of the substrate. Another conductive layer 21 is disposed on the passivation layer 20.

Figure 1H:
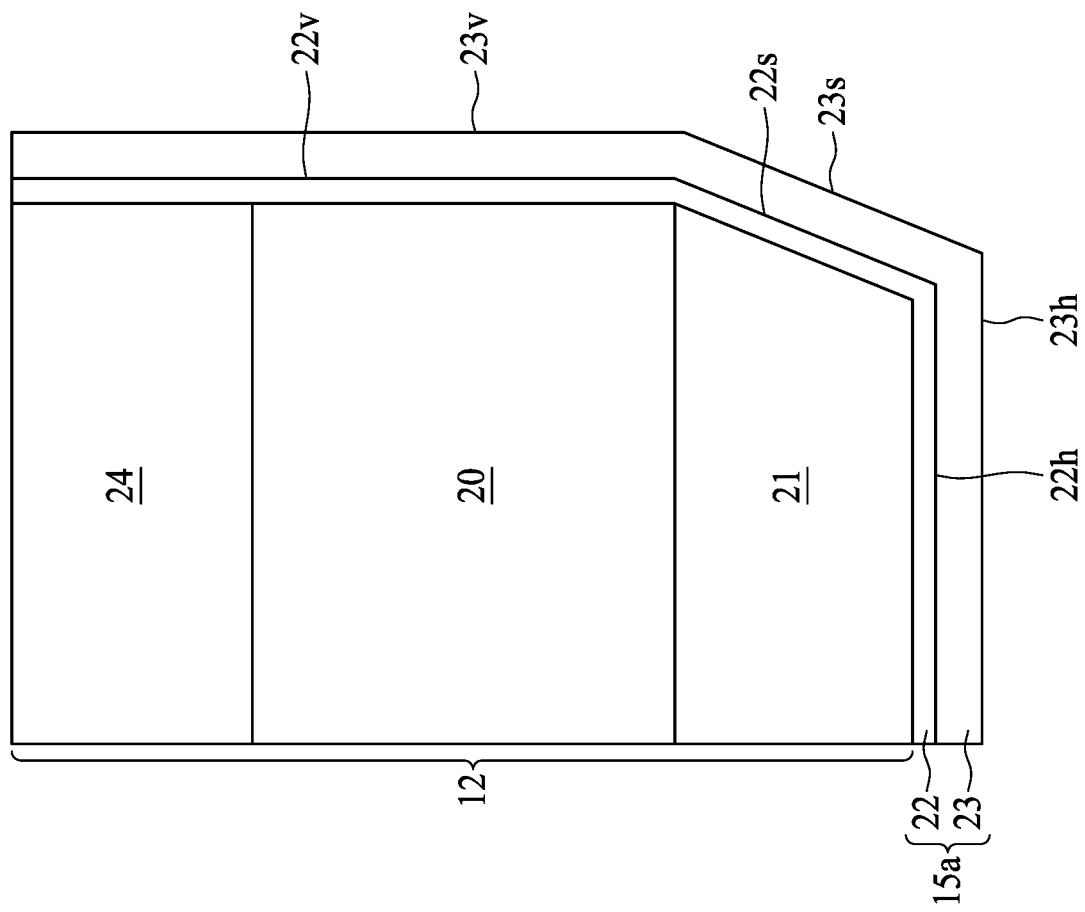
FIG. 1H illustrates an enlarged view of a structure in the dotted circle A as shown in FIG. 1A.

FIG. 1H illustrates an enlarged view of a structure in the dotted circle A as shown in FIG. 1A. FIG. 1F illustrates the RDL 12 and the connection element 15a at the outmost side of the semiconductor device package 1 at the outmost side of the substrate. FIG. 1H illustrates the RDL 12 and the connection elements 15a at the relatively periphery portions of the semiconductor device package 1. FIG. 1H illustrates the RDL 12 and the connection elements 15a around the edge portions of the semiconductor device package 1. A core layer 24 is provided. A passivation layer 20 is disposed below the core layer 24. A conductive layer 21 is disposed below the passivation layer 20. Another conductive layer 22 is disposed below the conductive layer 21. The conductive layer 22 surrounds the passivation layer 20. The conductive layer 22 is adjacent to the passivation layer 20. The conductive layer 22 is in direct contact with the passivation layer 20. The conductive layer 22 is adjacent to the conductive layer 21. The conductive layer 22 is in direct contact with the conductive layer 21. The conductive layers 21 and 22 comprise a same material.

The conductive layer 22 has a substantially slant sidewall 22s. The conductive layer 22 has a substantially vertical sidewall 22v. The conductive layer 22 has a substantially horizontal sidewall 22h. The substantially slant sidewall 22s is connected to the substantially horizontal sidewall 22h. The substantially slant sidewall 22s is connected to the substantially vertical sidewall 22v.

A barrier layer 23 is disposed below the conductive layer 22. The conductive layer 22 is disposed between the conductive layer 21 and the barrier layer 23. The barrier layer 23 surrounds the conductive layer 22. The barrier layer 23 encloses the conductive layer 22. The conductive layer 22 is adjacent to the barrier layer 23. The conductive layer 22 is in direct contact with the barrier layer 23. The barrier layer 23 is disposed below the conductive layer 21. The barrier layer 23 is formed by electroless plating.

The barrier layer 23 has a substantially slant sidewall 23s. The barrier layer 23 has a substantially vertical sidewall 23v. The barrier layer 23 has a substantially horizontal sidewall 23h. The substantially slant sidewall 23s is connected to the substantially horizontal sidewall 23h. The substantially slant sidewall 23s is connected to the substantially vertical sidewall 23v.

Figure 1I:
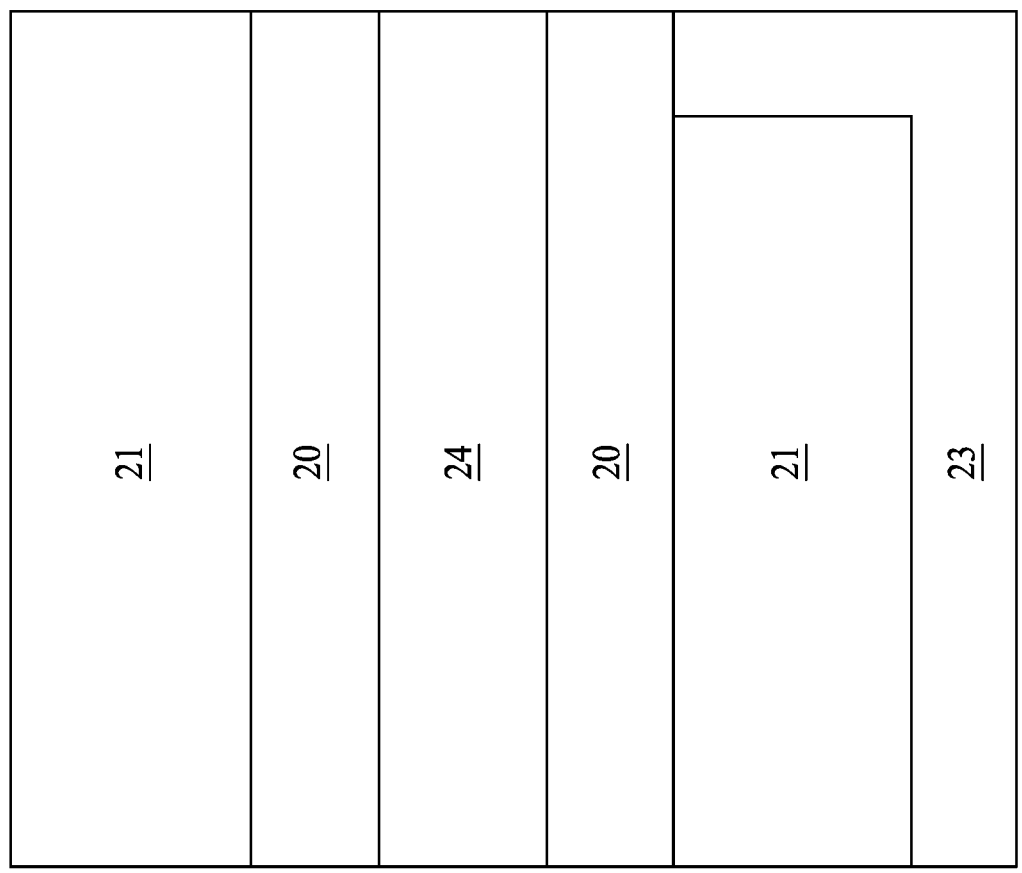
FIG. 1I illustrates an enlarged view of a connection element of a semiconductor device package according to some other embodiments of the present disclosure.

FIG. 1I illustrates an enlarged view of a connection element of a semiconductor device package according to some other embodiments of the present disclosure. A passivation layer 20 is provided. A conductive layer 21 is disposed below the passivation layer 20. A barrier layer 23 is disposed below the conductive layer 21. A core layer 24 is disposed on the passivation layer 20. Another passivation layer 20 is disposed on the core layer 24. Another conductive layer 21 is disposed on the passivation layer 21. The barrier layer 23 surrounds the conductive layer 21. The barrier layer 23 encloses the conductive layer 21. The barrier layer 23 is disposed below the conductive layer 21.

The barrier layer 23 has a substantially vertical sidewall 23v. The barrier layer 23 has a substantially horizontal sidewall 23h. The substantially vertical sidewall 23v is connected to the substantially horizontal sidewall 23h. There is no substantially slant sidewall.

FIG. 2A illustrates an assembly including a semiconductor device package mounted on a substrate. The semiconductor device package 1 is mounted on a substrate 27 via the connective structures 15a and 15b.

Figure 2B:
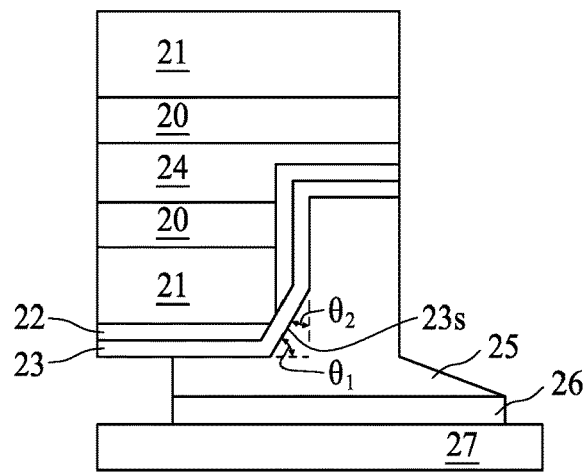
FIG. 2B illustrates an enlarged view of a structure in the dotted circle B as shown in FIG. 2A.

FIG. 2B illustrates an enlarged view of a structure in the dotted circle B as shown in FIG. 2A. The structure as shown in FIG. 1B is disposed on a solder 25. The solder 25 is physically and electrically connected to a connection element 26 on the substrate 27. An angle θ1 is the angle between the horizontal axis and the substantially slant sidewall 23s. The angle θ1 is less than 90 degrees. This helps the solder 25 to climb from the horizontal axis to the substantially slant sidewall 23s of the barrier layer 23. An angle θ2 is the angle between the vertical axis and the substantially slant sidewall 23s. The angle θ2 is less than 90 degrees. This helps the solder 25 to climb from the substantially slant sidewall 23s to the substantially vertical sidewall 23v of the barrier layer 23.

Figure 2C:
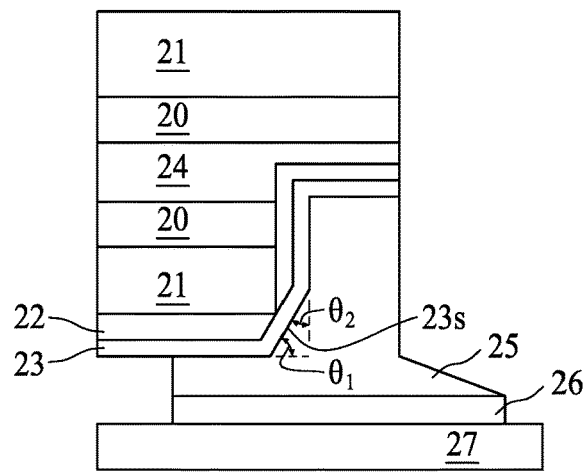
FIG. 2C illustrates an enlarged view of a structure in the dotted circle B as shown in FIG. 2A.

FIG. 2C illustrates an enlarged view of a structure in the dotted circle B as shown in FIG. 2A. The structure as shown in FIG. 1D is disposed on a solder 25. The solder 25 is physically and electrically connected to a connection element 26 on the substrate 27. An angle θ1 is the angle between the horizontal axis and the substantially slant sidewall 23s. The angle θ1 is less than 90 degrees. This helps the solder 25 to climb from the horizontal axis to the substantially slant sidewall 23s of the barrier layer 23. An angle θ2 is the angle between the vertical axis and the substantially slant sidewall 23s. The angle θ2 is less than 90 degrees. This helps the solder 25 to climb from the substantially slant sidewall 23s to the substantially vertical sidewall 23v of the barrier layer 23.

Figure 2D:
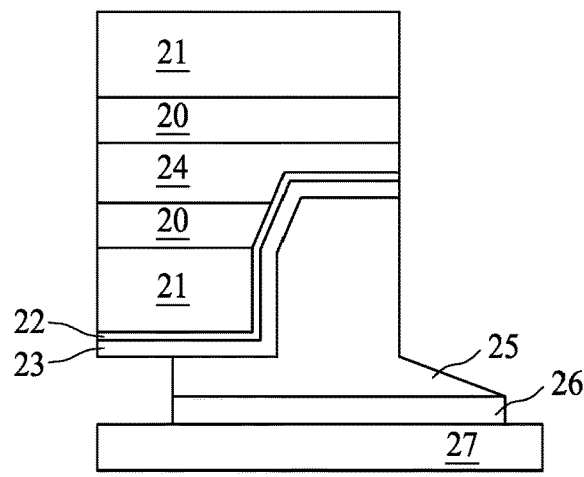
FIG. 2D illustrates an enlarged view of a structure in the dotted circle B as shown in FIG. 2A.

FIG. 2D illustrates an enlarged view of a structure in the dotted circle B as shown in FIG. 2A. The structure as shown in FIG. 1E is disposed on a solder 25. The structure as shown in FIG. 2D helps the solder to climb onto the structure as shown in FIG. 1E.

Figure 2E:
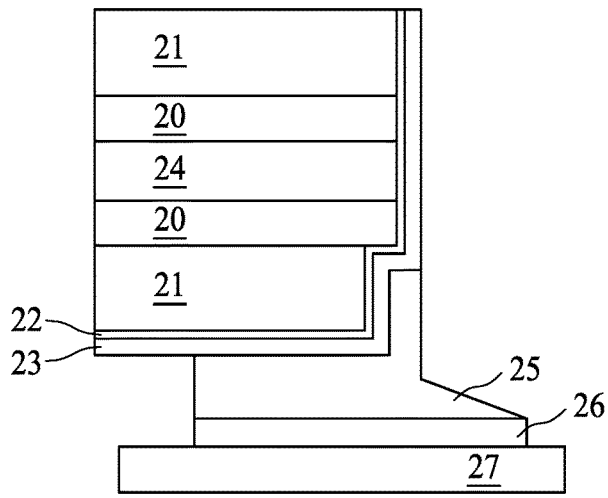
FIG. 2E illustrates an enlarged view of a structure in the dotted circle B as shown in FIG. 2A.

FIG. 2E illustrates an enlarged view of a structure in the dotted circle B as shown in FIG. 2A. The structure as shown in FIG. 1F is disposed on a solder 25. The structure as shown in FIG. 2E helps the solder to climb onto the structure as shown in FIG. 1F.

Figure 2F:
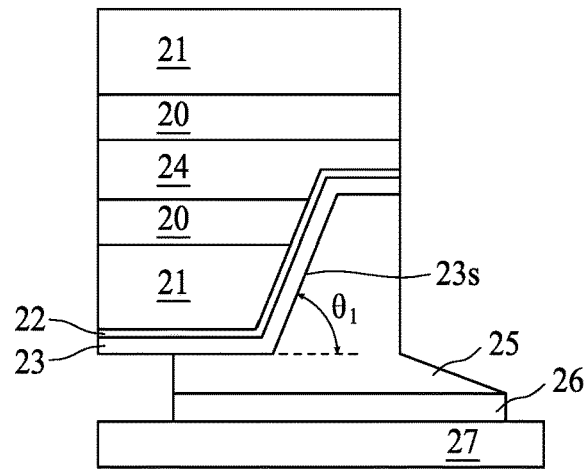
FIG. 2F illustrates an enlarged view of a structure in the dotted circle B as shown in FIG. 2A.

FIG. 2F illustrates an enlarged view of a structure in the dotted circle B as shown in FIG. 2A. The structure as shown in FIG. 1G is disposed on a solder 25. The solder 25 is physically and electrically connected to a connection element 26 on the substrate 27. An angle θ1 is the angle between the horizontal axis and the substantially slant sidewall 23s. The angle θ1 is less than 90 degrees. This helps the solder 25 to climb from the horizontal axis to the substantially slant sidewall 23s of the barrier layer 23.

Figure 2G:
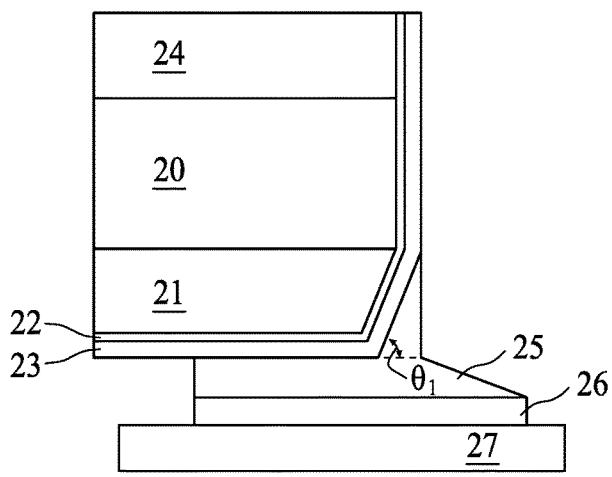
FIG. 2G illustrates an enlarged view of a structure in the dotted circle B as shown in FIG. 2A.

FIG. 2G illustrates an enlarged view of a structure in the dotted circle B as shown in FIG. 2A. The structure as shown in FIG. 1H is disposed on a solder 25. The solder 25 is physically and electrically connected to a connection element 26 on the substrate 27. An angle θ1 is the angle between the horizontal axis and the substantially slant sidewall 23s. The angle θ1 is less than 90 degrees. This helps the solder 25 to climb from the horizontal axis to the substantially slant sidewall 23s of the barrier layer 23.

Figure 2H:
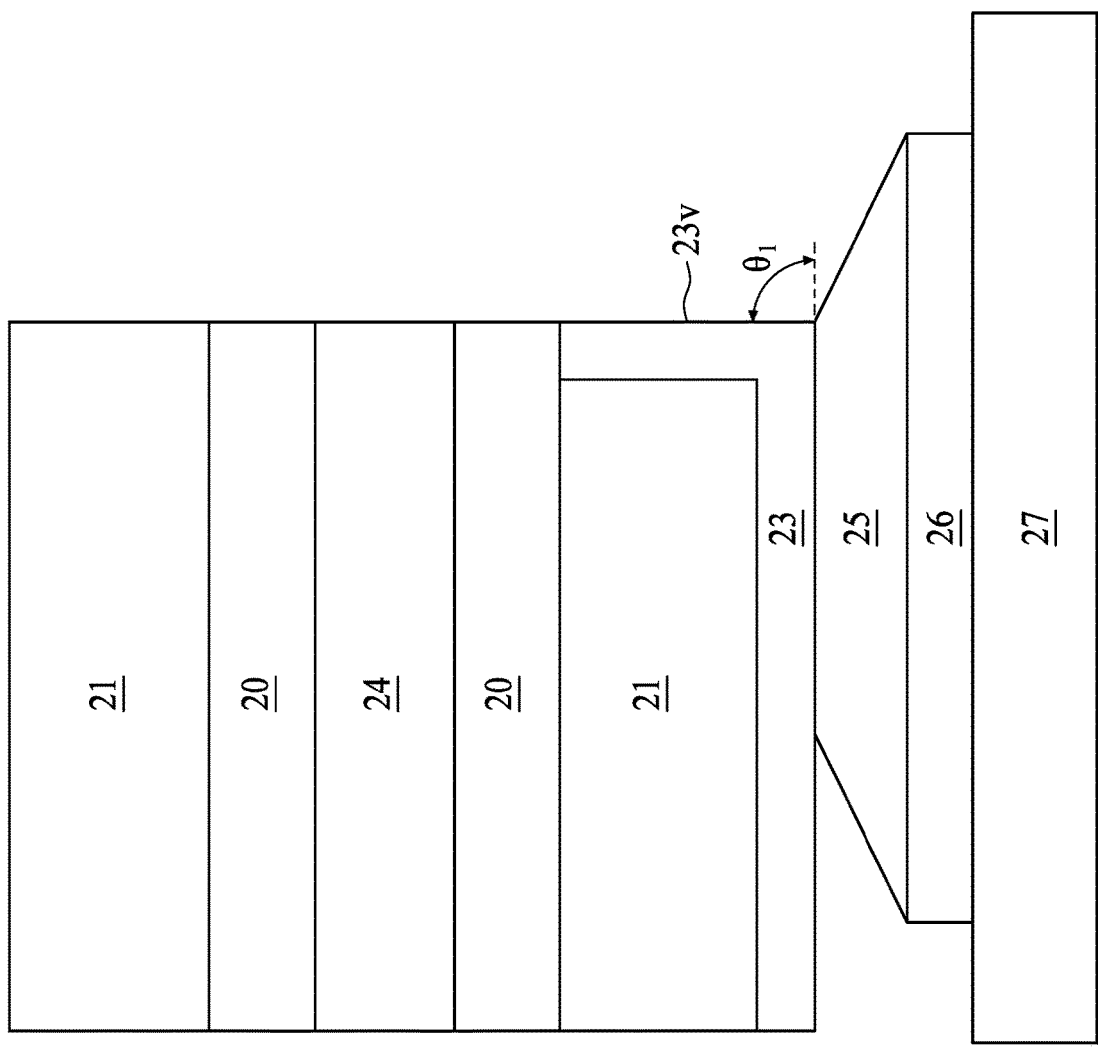
FIG. 2H illustrates an enlarged view of a structure in the dotted circle B as shown in FIG. 2A according to some other embodiments of the present disclosure.

FIG. 2H illustrates an enlarged view of a structure in the dotted circle B as shown in FIG. 2A according to some other embodiments of the present disclosure. The structure as shown in FIG. 1I is disposed on a solder 25. The solder 25 is physically and electrically connected to a connection element 26 on the substrate 27. An angle θ1 is the angle between the horizontal axis and the substantially slant sidewall 23s. The angle θ1 is substantially 90 degrees. It is difficult for the solder 25 to climb from the horizontal axis to a substantially vertical sidewall 23v of the barrier layer 23. It is also difficult to use machines to determine the reliability of the connection of the solder 25. Therefore, the efficiency of the manufacturing processes of the semiconductor device packages is adversely degraded.

Figure 3:
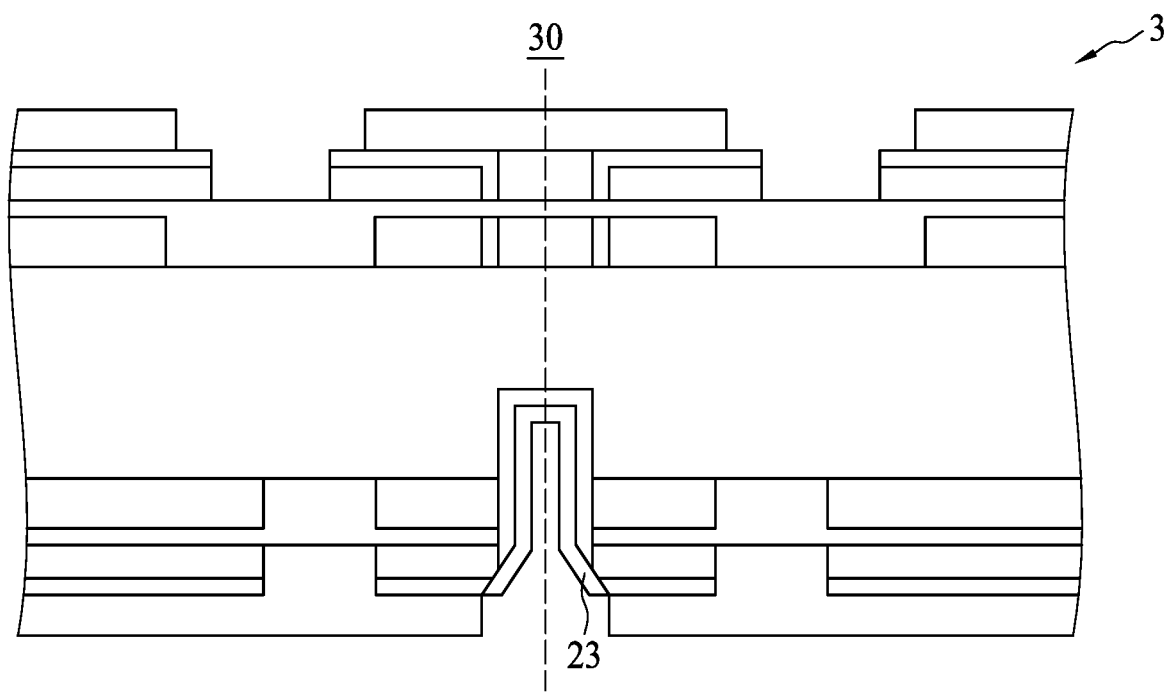
FIG. 3 illustrates a cross-sectional view of a panel or a strip of some semiconductor device packages according to some embodiments of the present disclosure.
Figure 3:
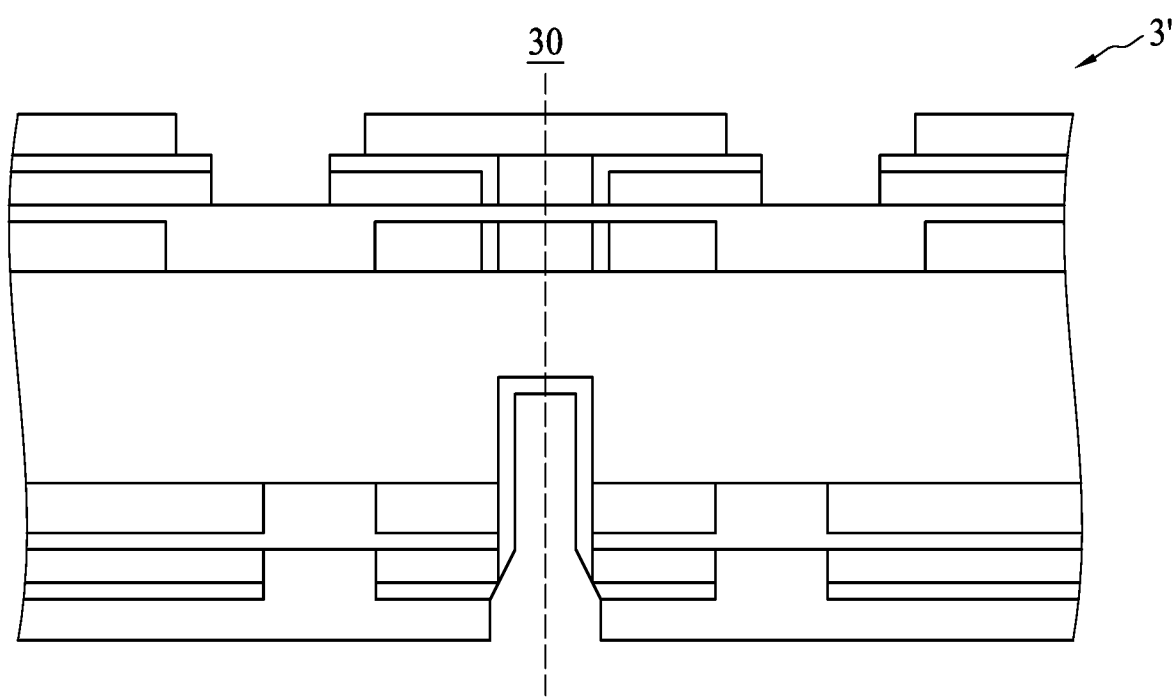

FIG. 3 illustrates a cross-sectional view of a panel or a strip of some semiconductor device packages according to some embodiments of the present disclosure. A semiconductor substrate structure 3 is formed by the processes illustrated in FIG. 3A through FIG. 3H. The substrate structures as shown in FIG. 3 are electrically connected. Electrical tests can be applied to the substrate structures as shown in FIG. 3. After the electrical tests, the semiconductor substrate structures as shown in FIG. 3 are singulated by being cut on the scribe line 30.

FIG. 3' illustrates a cross-sectional view of a panel or a strip of some semiconductor device packages according to some embodiments of the present disclosure. A semiconductor substrate structure 3' is formed by the processes illustrated in FIG. 3A through FIG. 3F and FIG. 3J, FIG. 3K and FIG. 3L. The substrate structures as shown in FIG. 3' are electrically connected. Electrical tests can be applied to the substrate structures as shown in FIG. 3'. After the electrical tests, the semiconductor substrate structures as shown in FIG. 3' are singulated by being cut on the scribe line 30.

Figure 3A:
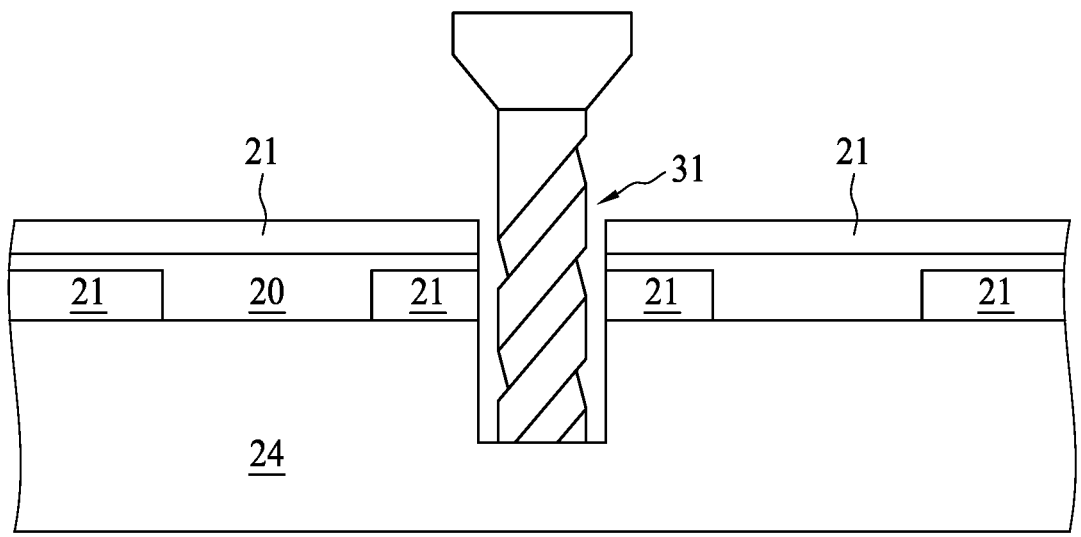
FIG. 3A, FIG. 3B, FIG. 3C, FIG. 3D, FIG. 3E, FIG. 3F, FIG. 3G, FIG. 3H and FIG. 3I illustrate a method of manufacturing a semiconductor device package as shown in FIG. 3.

FIG. 3A illustrates providing a semiconductor structure. The semiconductor structure includes a core layer 24. A conductive layer 21 is patterned and disposed on the core layer 24. A passivation layer 20 is disposed on the conductive layer 21. Another conductive layer 21 is disposed on the passivation 20. A driller drills the conductive layer 21, the passivation layer 20 and the core layer 24 to form a hole 31. The drilling is performed on scribe lines of a stripe or a panel of substrates. During the drilling of the semiconductor structure, burrs are generated.

After manufacturing the structure as shown in FIG. 3A, the burrs generated during the drilling are removed. The removing includes removing the burrs using $KMnO_4$.

Figure 3B:
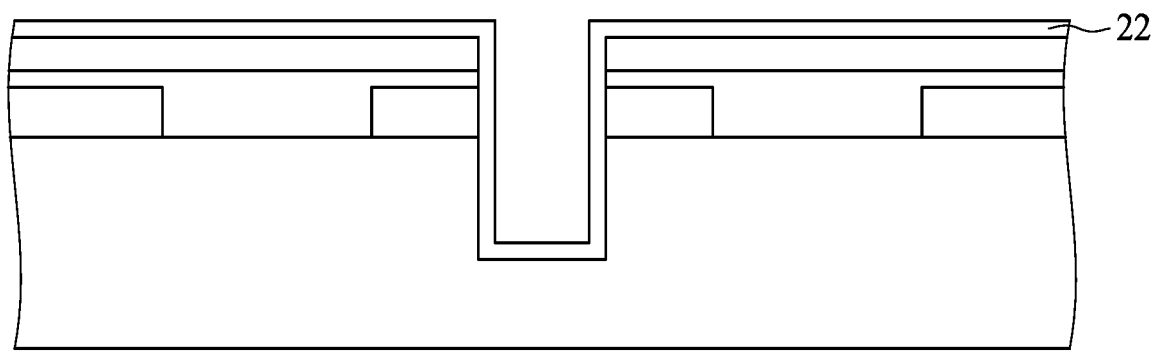

FIG. 3B illustrates a conductive layer 22 is disposed on the structure as shown in FIG. 3A. The conductive layer 22 includes copper. The conductive layer includes electroless plated copper.

Figure 3C:
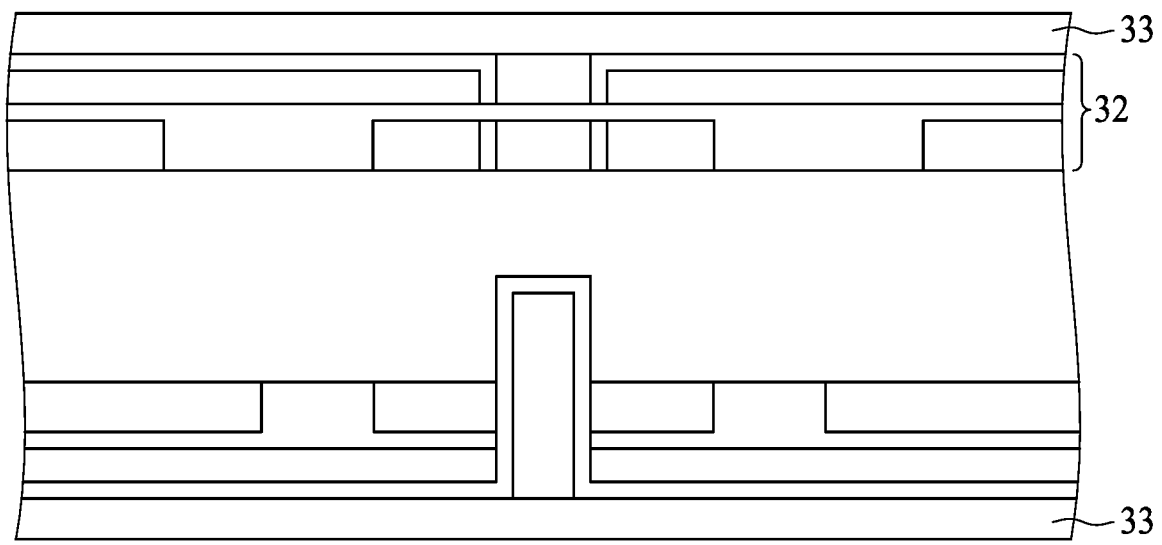

FIG. 3C illustrates that the structure as shown in FIG. 3B is placed upside down. Another structure 32 is formed on the upside down structure. Afterwards, the structure is sandwiched by a dry film lamination 33.

Figure 3D:
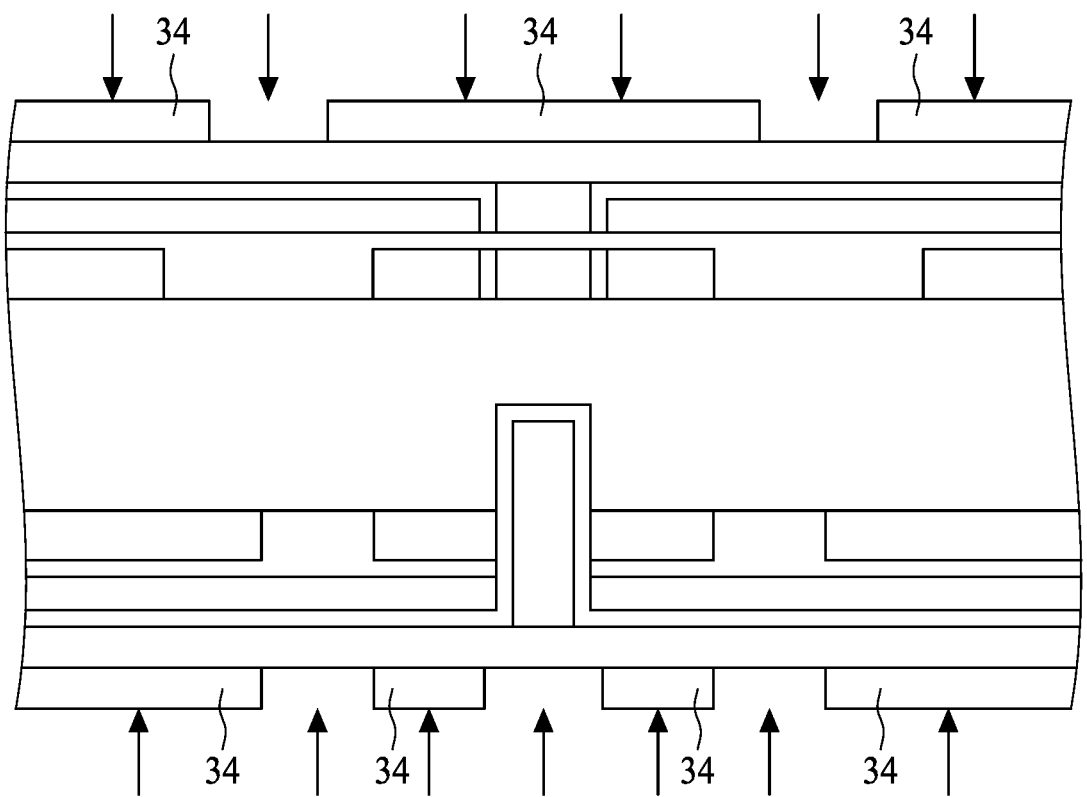

FIG. 3D illustrates that a patterned photoresist layer 34 is disposed to sandwich the structure as shown in FIG. 3C. The structure is exposed to light of certain wavelengths.

Figure 3E:
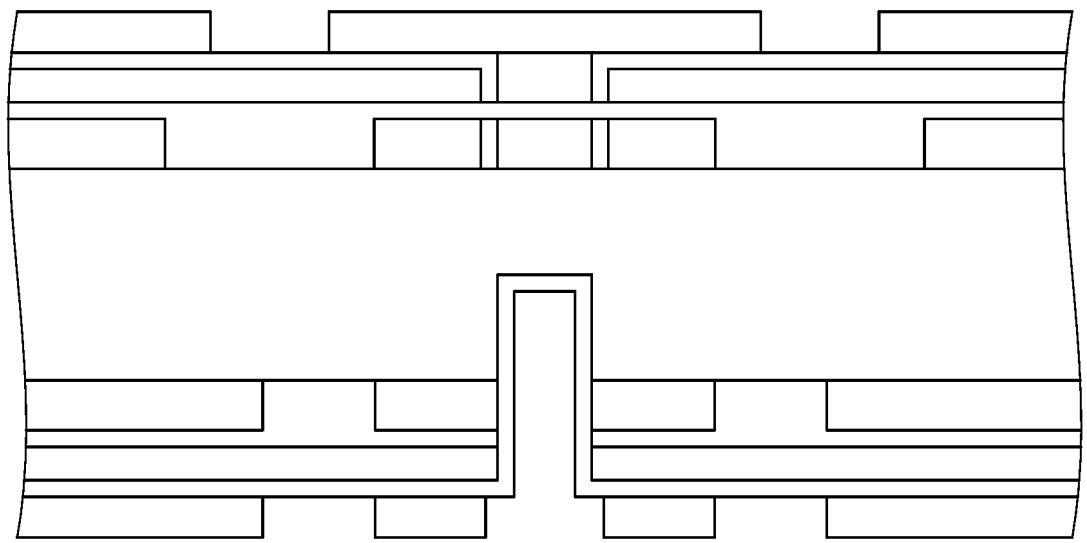

FIG. 3E illustrates that after exposing to light, some portions of the dry film lamination 33 are removed. Afterwards, the patterned photoresist layer 34 is also removed by etching.

Figure 3F:
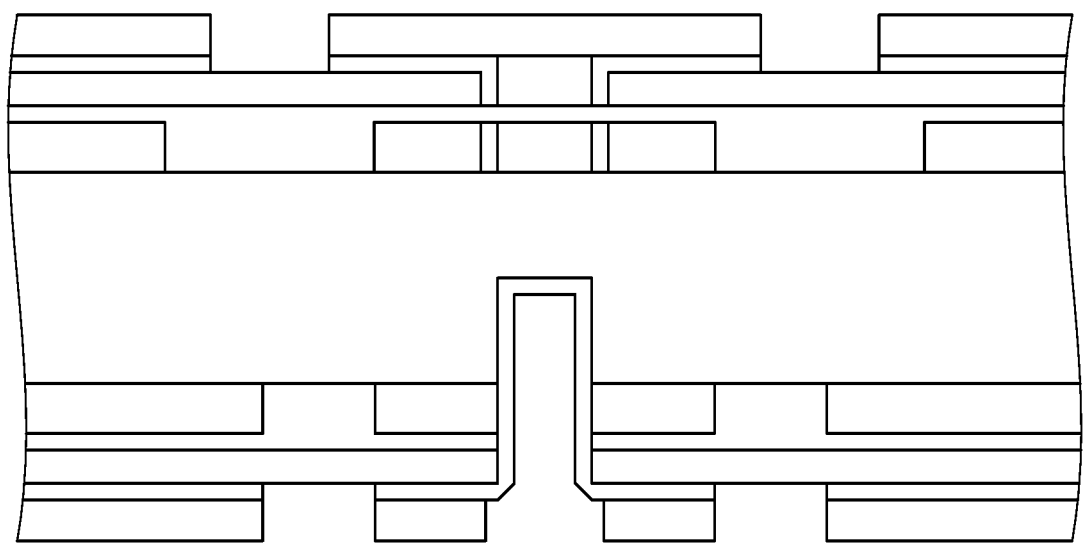

FIG. 3F illustrates that portions of the conductive layer 22 disposed in the structure as shown in FIG. 3E are removed. The removing of the conductive layer 22 is performed by etching. An etchant is used to etch a portion of the conductive layer 22.

Figure 3G:
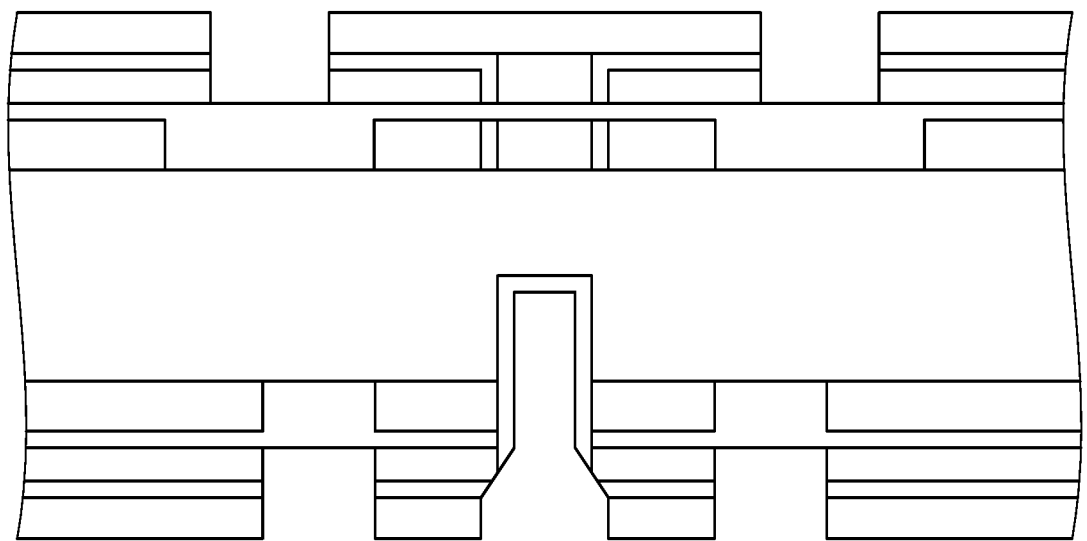

FIG. 3G illustrates that the portions of the conductive layer 22 are further removed from the structure as shown in FIG. 3F. The structure as shown in FIG. 3F is etched again. After etching, the conductive layer 22 is not continuous. The conductive layer 22 has two portions separated from each other. Portions of the conductive layer 21 are also etched during the etching.

Because the etchant is isotropic, the etching rate to etch copper of a plane structure is faster than the etching rate to etch copper in a hole. The etching technique is performed twice to form a desired shape of the conductive layer as shown in FIG. 3G.

Figure 3H:
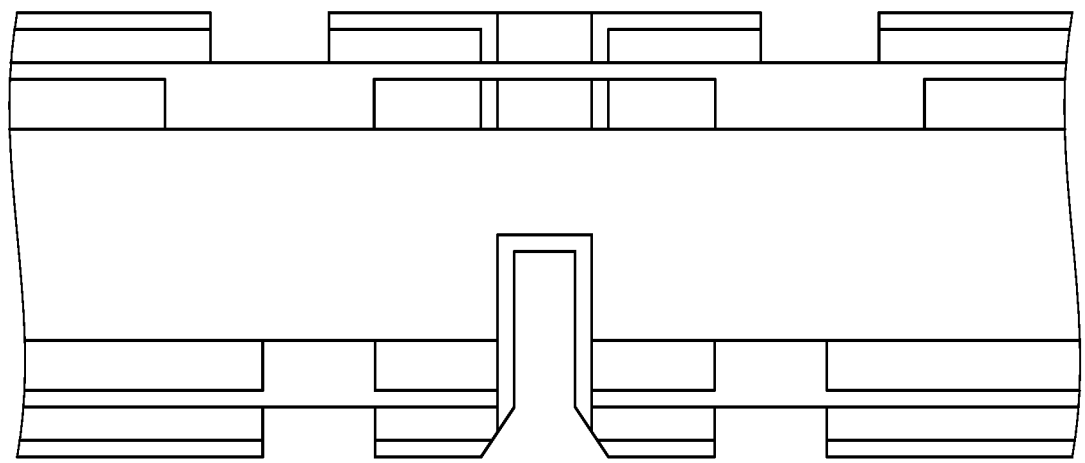

FIG. 3H illustrates removing the dry film lamination 33 from the structure as shown in FIG. 3G.

Figure 3I:
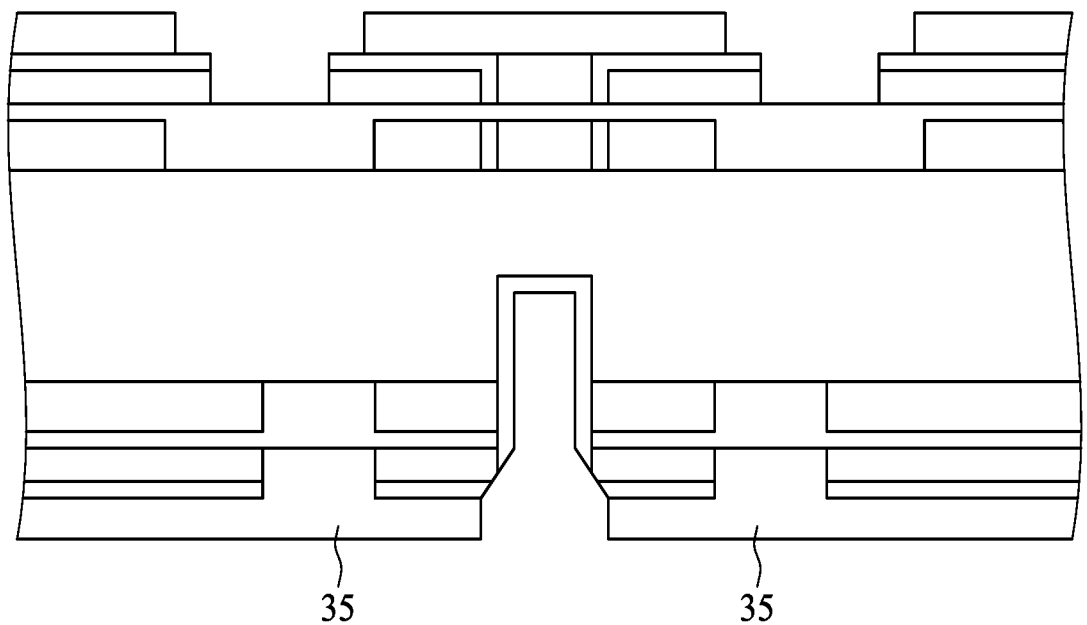

FIG. 3I illustrates disposing patterned solder resist 35 to sandwich the structure as shown in FIG. 3H. After manufacturing the structure as shown in FIG. 3H, a barrier layer 23 is disposed on the conductive layer 22 to arrive at the structure as shown in FIG. 3. The barrier layer 23 includes nickel and gold. The barrier layer 23 is formed by electroless plating. Afterwards, the structure as shown in FIG. 3 is singulated to form a semiconductor device package.

Figure 3J:
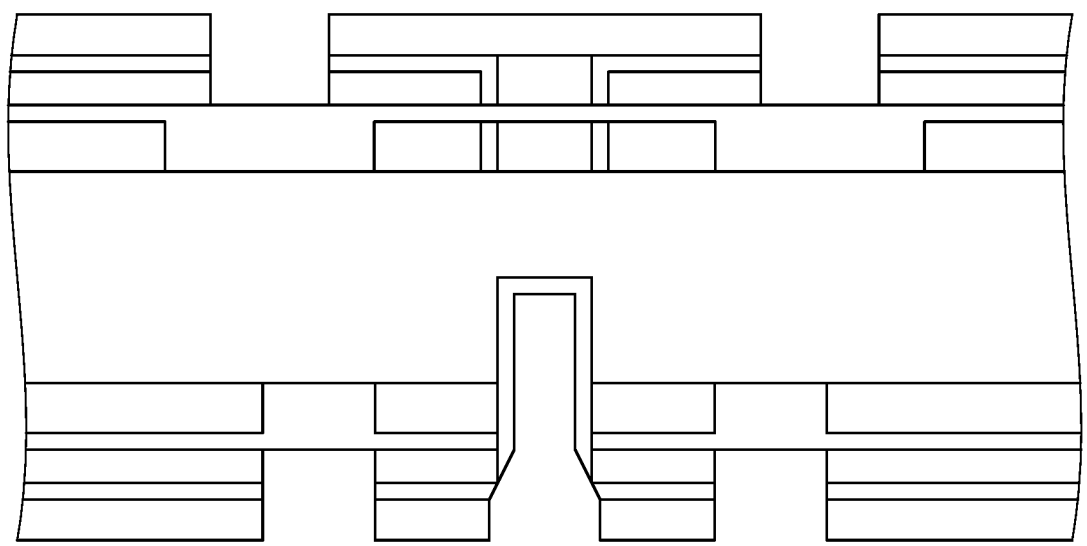

FIG. 3J follows the operations of FIG. 3A through FIG. 3F. FIG. 3J illustrates that portions of the conductive layer 22 are further removed from the structure as shown in FIG. 3F. The structure as shown in FIG. 3F is etched again. After etching, the conductive layer 22 is not continuous. The conductive layer 22 has two portions separated from each other. Portions of the conductive layer 21 are also etched during the etching. A vertex of the conductive layer 21 is in contact with the substantially slant sidewall 22s.

Figure 3K:
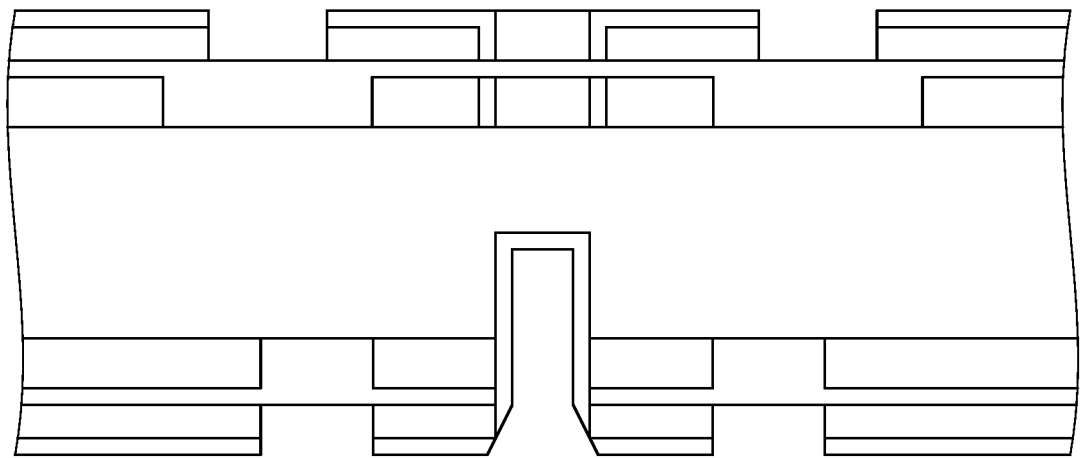

FIG. 3K illustrates removing the dry film lamination 32 from the structure as shown in FIG. 3J.

Figure 3L:
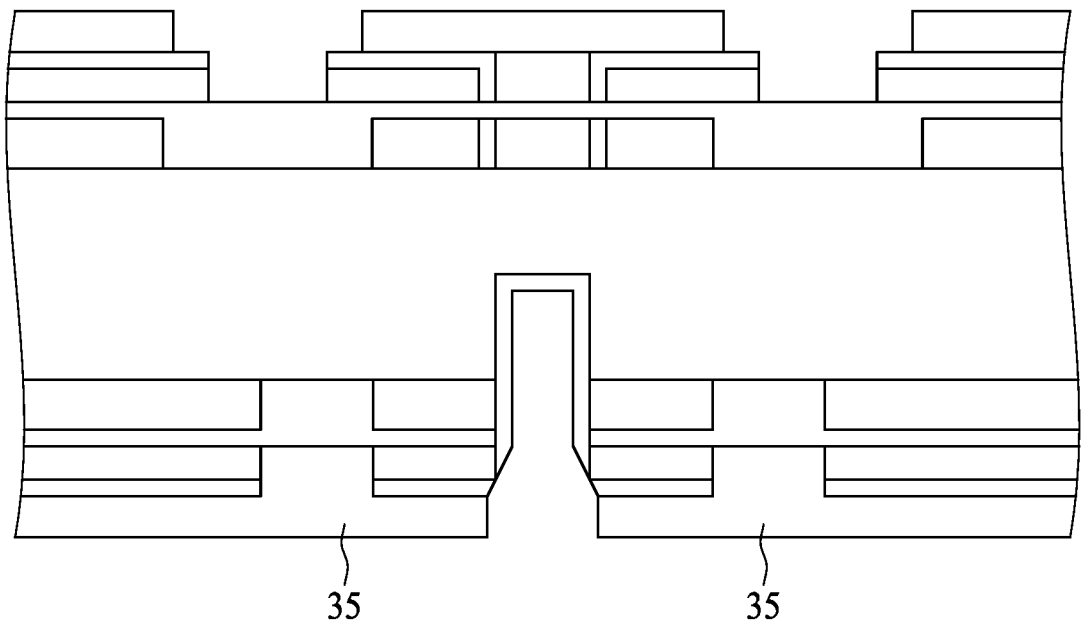

FIG. 3L illustrates disposing patterned solder resist 35 to sandwich the structure as shown in FIG. 3K. After manufacturing the structure as shown in FIG. 3L, a barrier layer 23 is disposed on the conductive layer 22 to arrive at the structure as shown in FIG. 3'. The barrier layer 23 includes nickel and gold. The barrier layer 23 is formed by electroless plating. Afterwards, the structure as shown in FIG. 3' is singulated to form a semiconductor device package.

Figure 4:
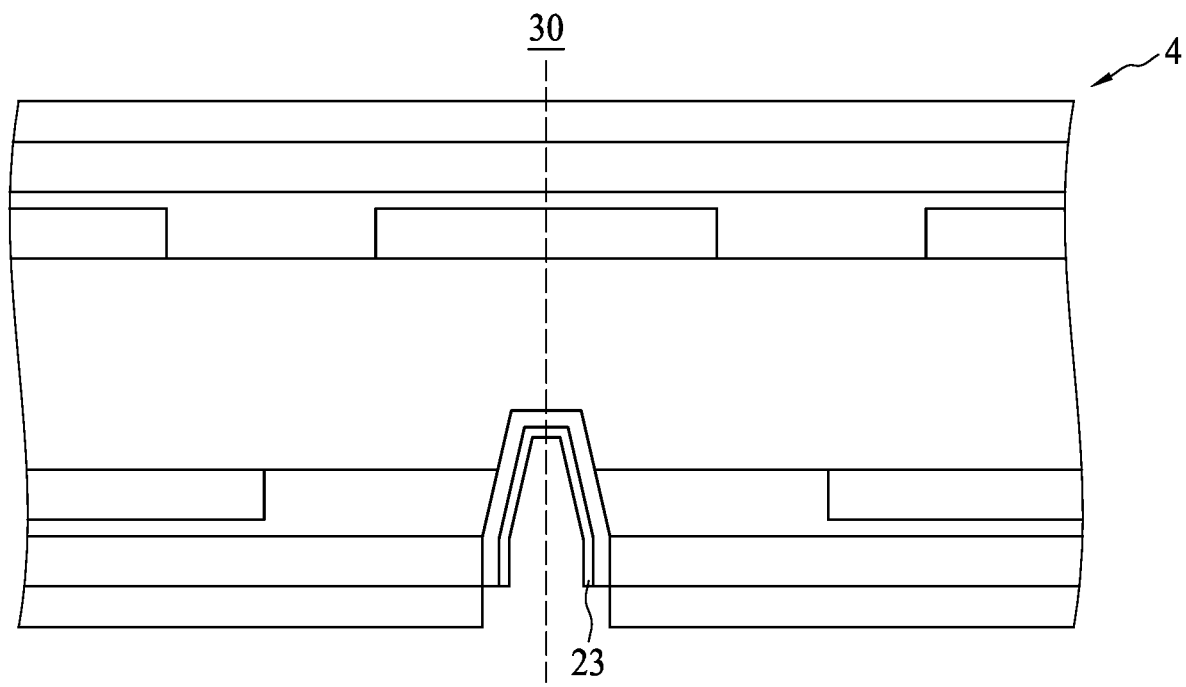
FIG. 4 illustrates a cross-sectional view of a panel or a strip of some semiconductor device packages according to some embodiments of the present disclosure.

FIG. 4 illustrates a cross-sectional view of a panel or a strip of some semiconductor device packages according to some embodiments of the present disclosure. A semiconductor substrate structure 4 is formed by the processes illustrated in FIG. 4A through FIG. 4H. The substrate structures as shown in FIG. 4 are electrically connected. Electrical tests can be applied to the substrate structures as shown in FIG. 4. After the electrical tests, the semiconductor substrate structures as shown in FIG. 4 are singulated by being cut on the scribe line 30.

Figure 4A:
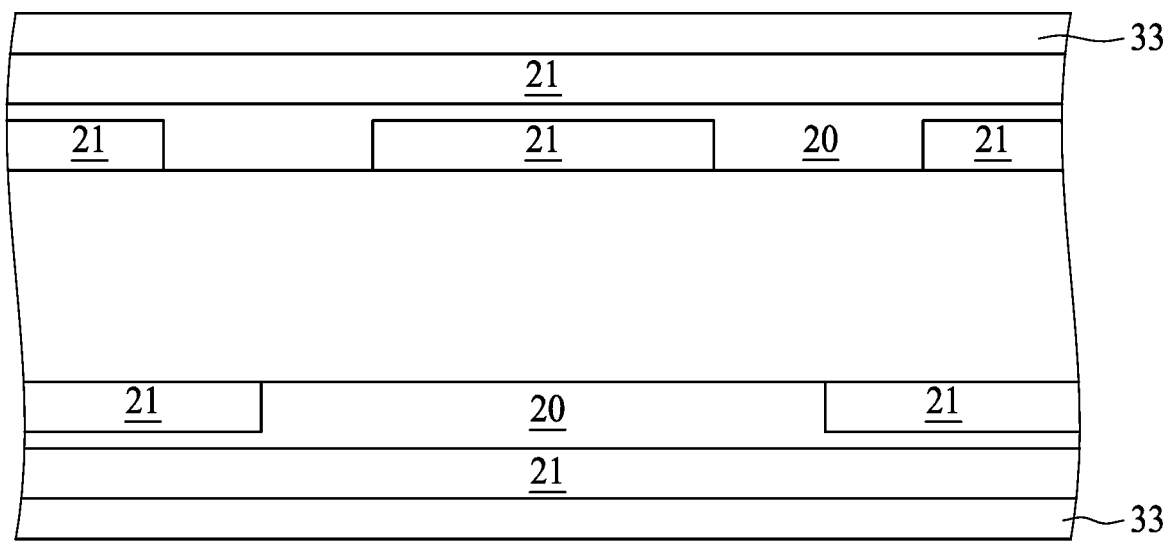
FIG. 4A, FIG. 4B, FIG. 4C, FIG. 4D, FIG. 4E, FIG. 4F, FIG. 4G and FIG. 4H illustrate a method of manufacturing a semiconductor device package as shown in FIG. 4.

FIG. 4A illustrates providing a semiconductor structure. The semiconductor structure includes a core layer 24. An upper patterned conductive layer 21 is disposed on the core layer 24. A lower patterned conductive layer 21 is disposed below the core layer 24. An upper passivation layer 20 is disposed on the upper patterned conductive layer 21. A lower passivation layer 20 is disposed below the lower patterned conductive layer 21. The upper patterned conductive layer 21 is disposed on the upper passivation layer 20. The lower patterned conductive layer 21 is disposed below the lower passivation layer 20. A dry film lamination 33 is disposed on the upper patterned conductive layer 21. A dry film lamination 33 is disposed below the lower patterned conductive layer 21.

Figure 4B:
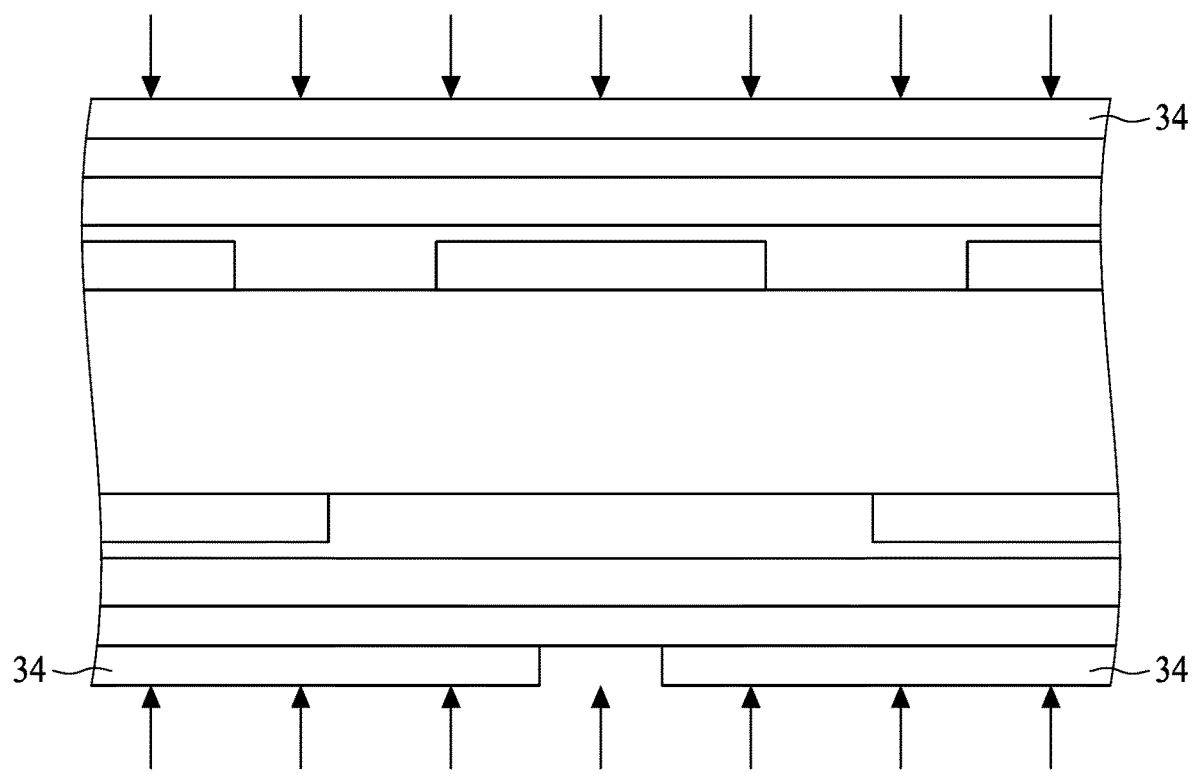

FIG. 4B illustrates that a patterned photoresist layer 34 is disposed to sandwich the structure as shown in FIG. 4A. Afterwards, the structure as shown in FIG. 4B is exposed to light of certain wavelengths.

Figure 4C:
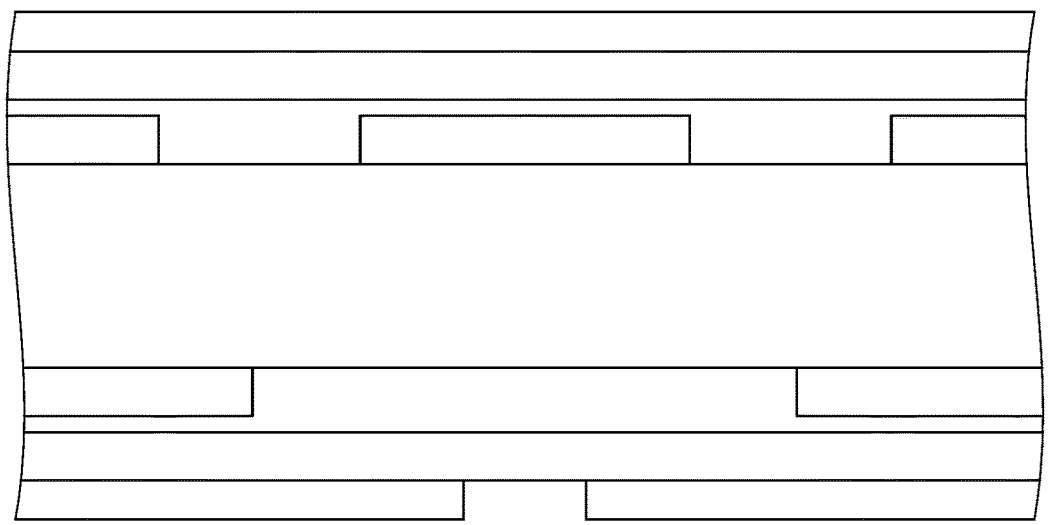

FIG. 4C illustrates that after exposing to light, a portion of the dry film lamination 33 is removed. Afterwards, the patterned photoresist layer 34 is also removed by etching.

Figure 4D:
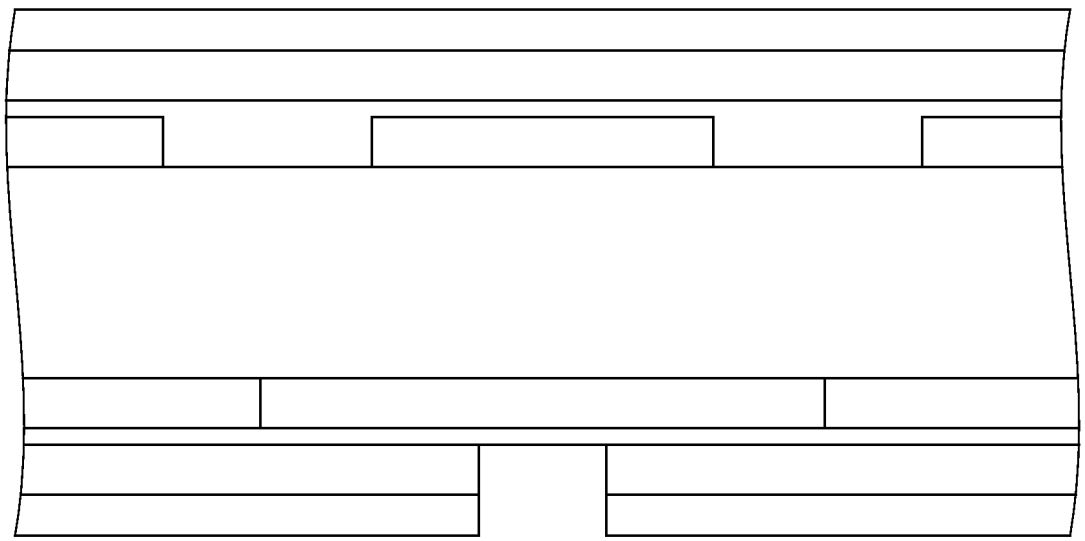

FIG. 4D illustrates that a portion of the conductive layer 21 is removed. The portion of the conductive layer 21 is substantially aligned with the removed portion of the dry film lamination 33.

Figure 4E:
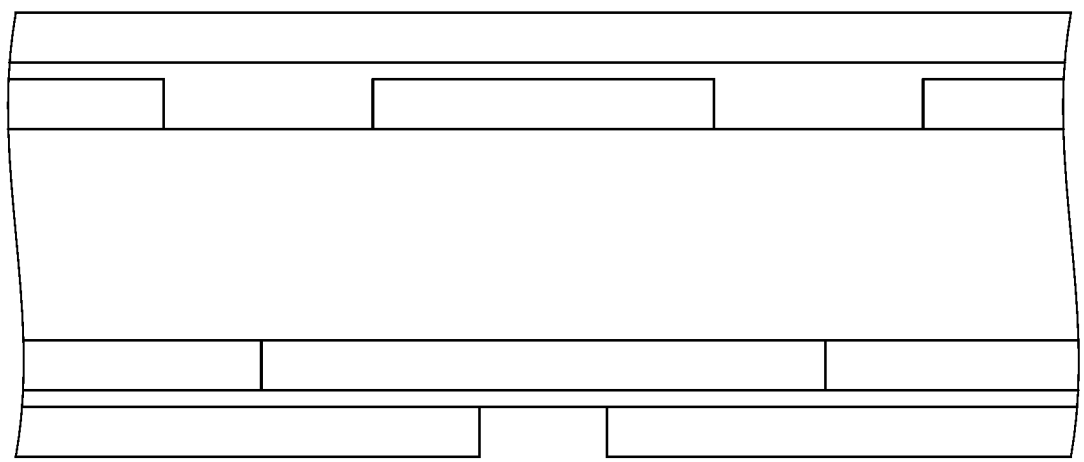

FIG. 4E illustrates removing the dry film lamination 33 from the structure as shown in FIG. 4D.

Figure 4F:
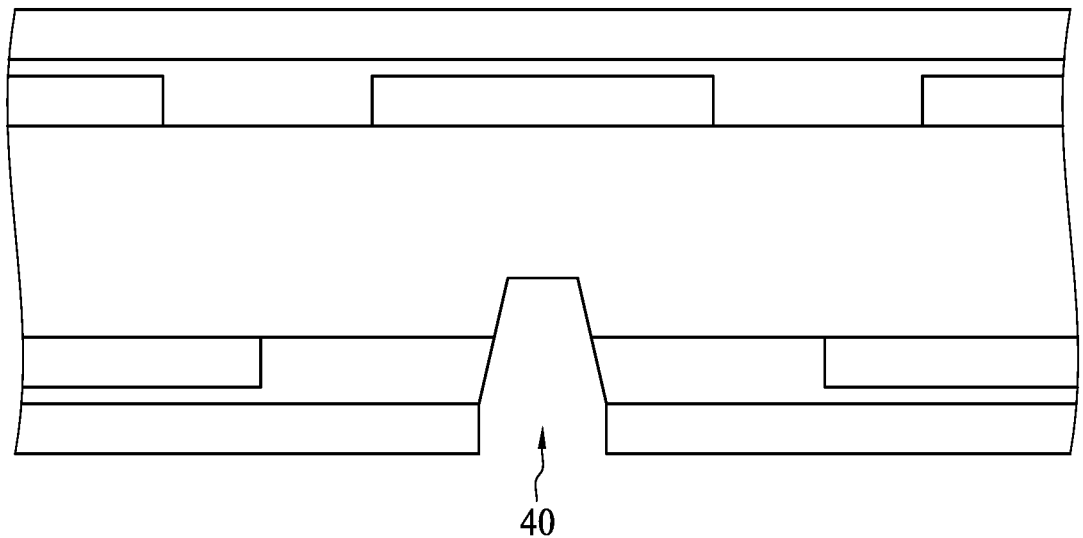

FIG. 4F illustrates removing a portion of the passivation layer 20 from the structure as shown in FIG. 4E. A laser is used to remove the portion of the passivation layer 20. A portion of the core layer 24 is also removed.

Figure 4G:
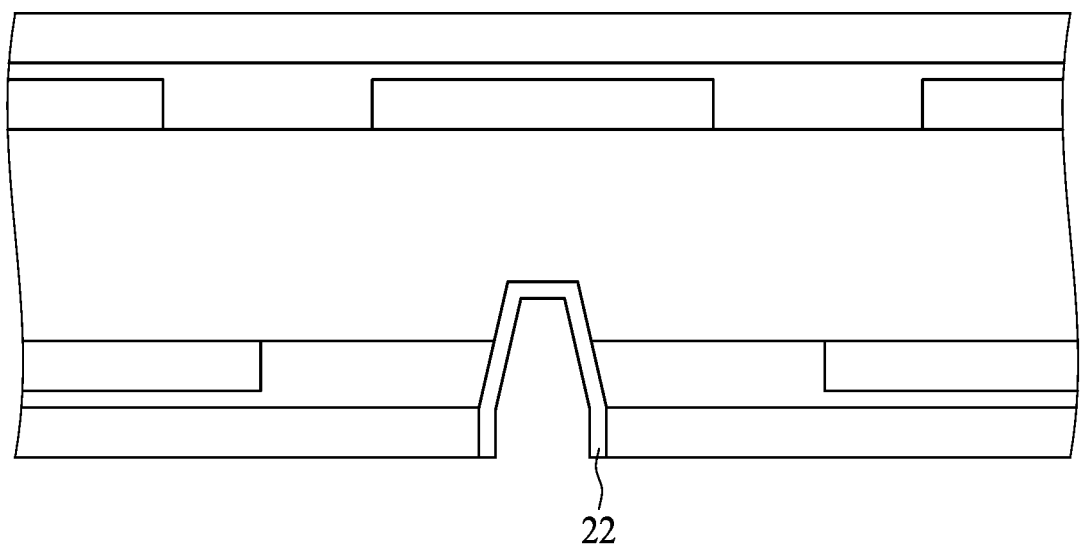

FIG. 4G illustrates disposing a conductive layer 22 in the hole 40 as shown in FIG. 4F. The conductive layer 22 is electroless plated in the hole 40.

Figure 4H:
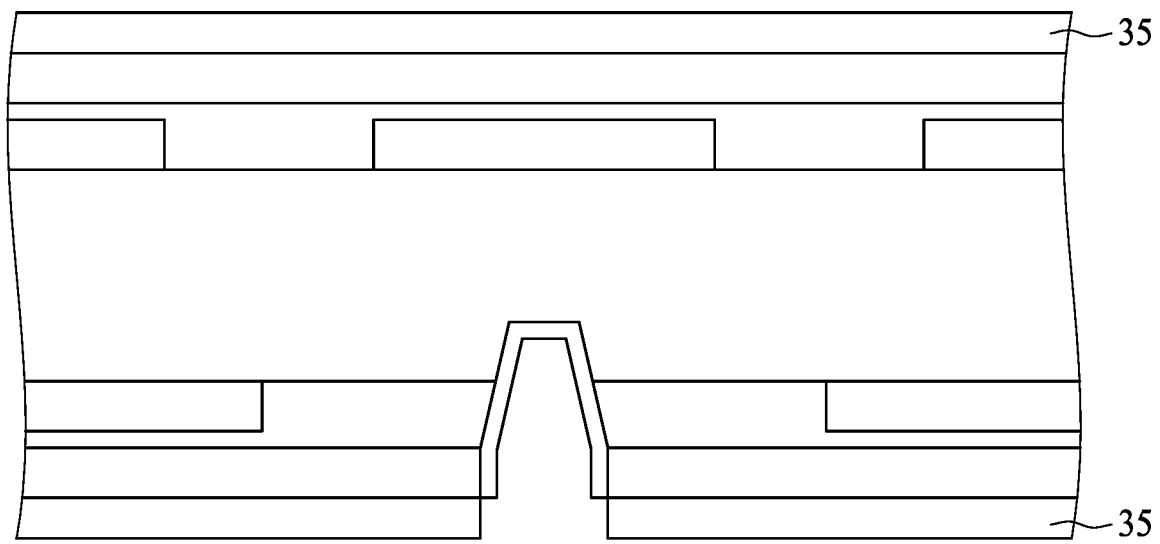

FIG. 4H illustrates disposing patterned solder resist 35 to sandwich the structure as shown in FIG. 4G.

After manufacturing the structure as shown in FIG. 4H, a barrier layer 23 is disposed on the conductive layer 22 to arrive at the structure as shown in FIG. 4. The barrier layer 23 includes nickel and gold. The barrier layer 23 is formed by electroless plating. Afterwards, the structure as shown in FIG. 4 is singulated to form a semiconductor device package.

Figure 5:
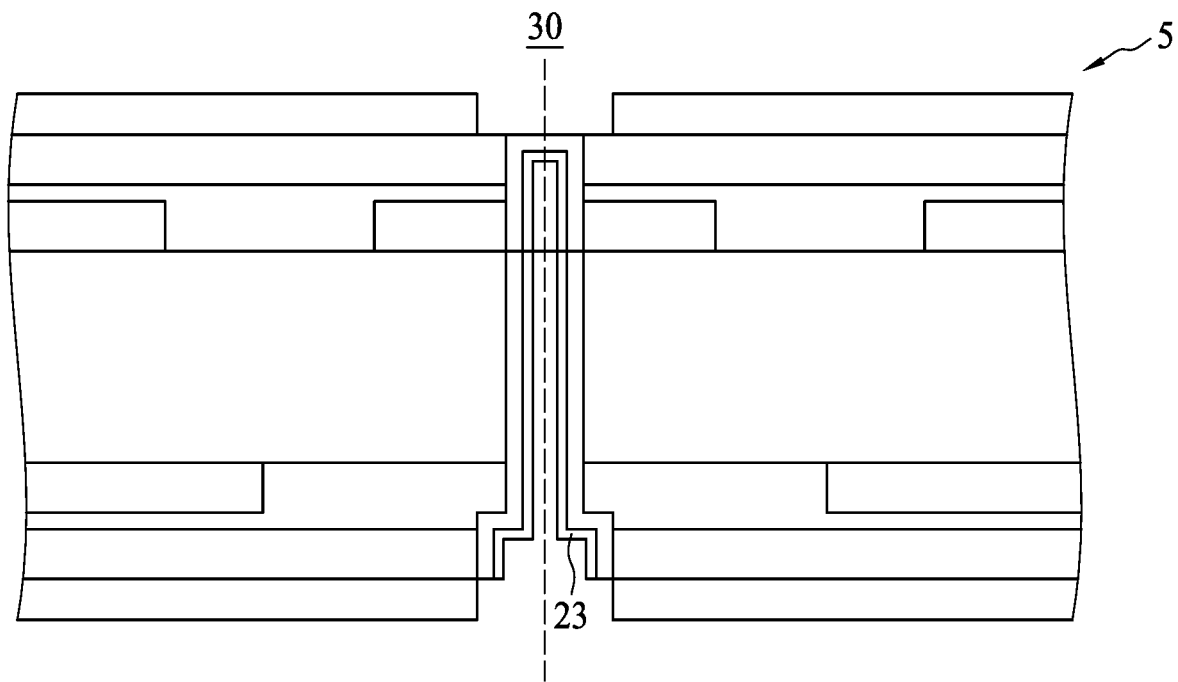
FIG. 5 illustrates a cross-sectional view of a panel or a strip of some semiconductor device packages according to some embodiments of the present disclosure.

FIG. 5 illustrates a cross-sectional view of a panel or a strip of some semiconductor device packages according to some embodiments of the present disclosure. A semiconductor substrate structure 5 is formed by the processes illustrated in FIG. 5A through FIG. 5H. The substrate structures as shown in FIG. 5 are electrically connected. Electrical tests can be applied to the substrate structures as shown in FIG. 5. After the electrical tests, the semiconductor substrate structures as shown in FIG. 5 are singulated by being cut on the scribe line 30.

Figure 5A:
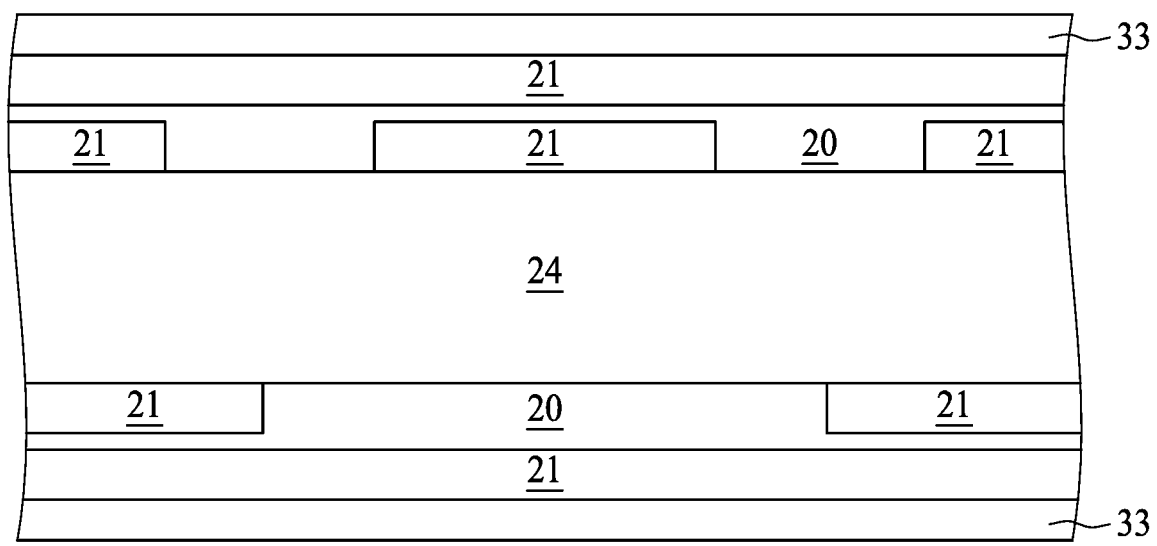
FIG. 5A, FIG. 5B, FIG. 5C, FIG. 5D, FIG. 5E, FIG. 5F, FIG. 5G and FIG. 5H illustrate a method of manufacturing a semiconductor device package as shown in FIG. 5.

FIG. 5A illustrates providing a semiconductor structure. The semiconductor structure includes a core layer 24. An upper patterned conductive layer 21 is disposed on the core layer 24. A lower patterned conductive layer 21 is disposed below the core layer 24. An upper passivation layer 20 is disposed on the upper patterned conductive layer 21. A lower passivation layer 20 is disposed below the lower patterned conductive layer 21. The upper patterned conductive layer 21 is disposed on the upper passivation layer 20. The lower patterned conductive layer 21 is disposed below the lower passivation layer 20. A dry film lamination 33 is disposed on the upper patterned conductive layer 21. A dry film lamination 33 is disposed below the lower patterned conductive layer 21.

Figure 5B:
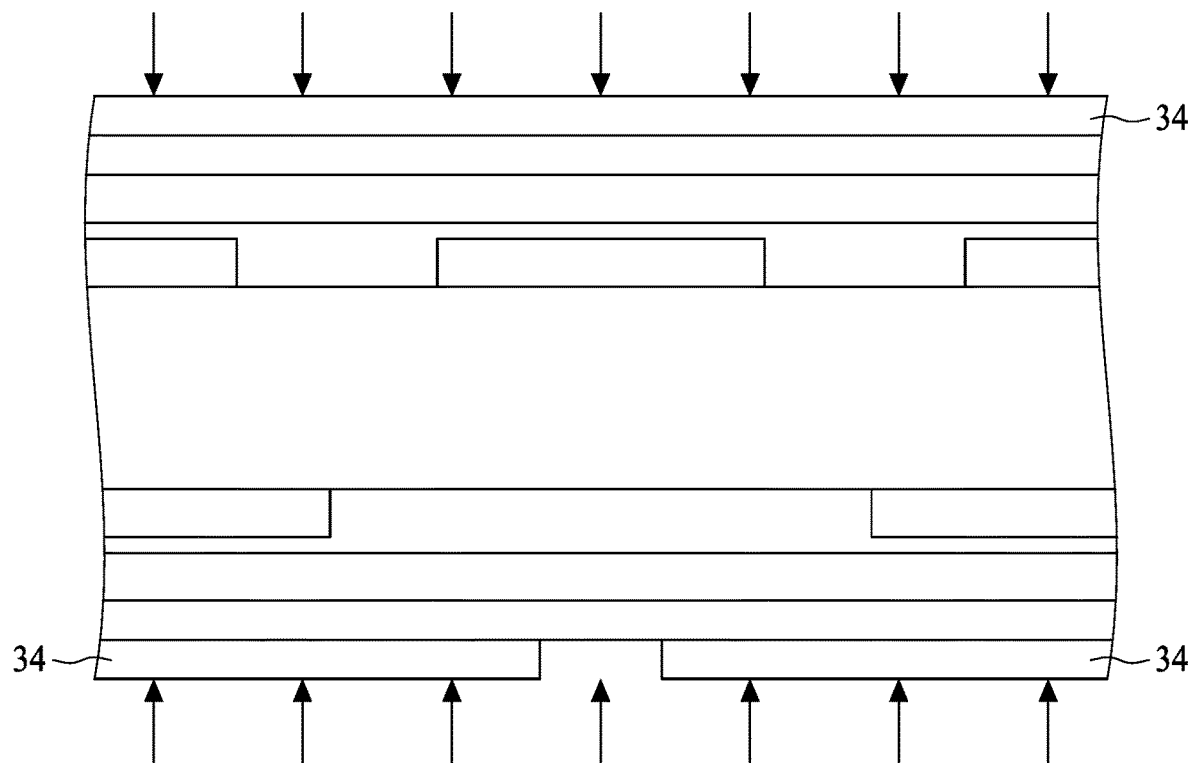

FIG. 5B illustrates that a patterned photoresist layer 34 is disposed to sandwich the structure as shown in FIG. 5A. Afterwards, the structure as shown in FIG. 5B is exposed to light of certain wavelengths.

Figure 5C:
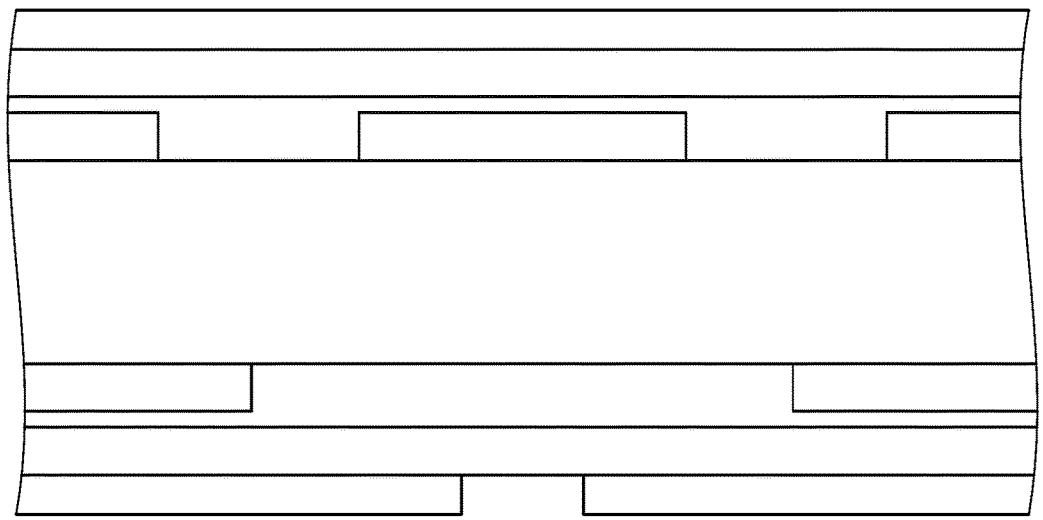

FIG. 5C illustrates that after exposing to light, a portion of the dry film lamination 33 is removed. Afterwards, the patterned photoresist layer 34 is also removed by etching.

Figure 5D:
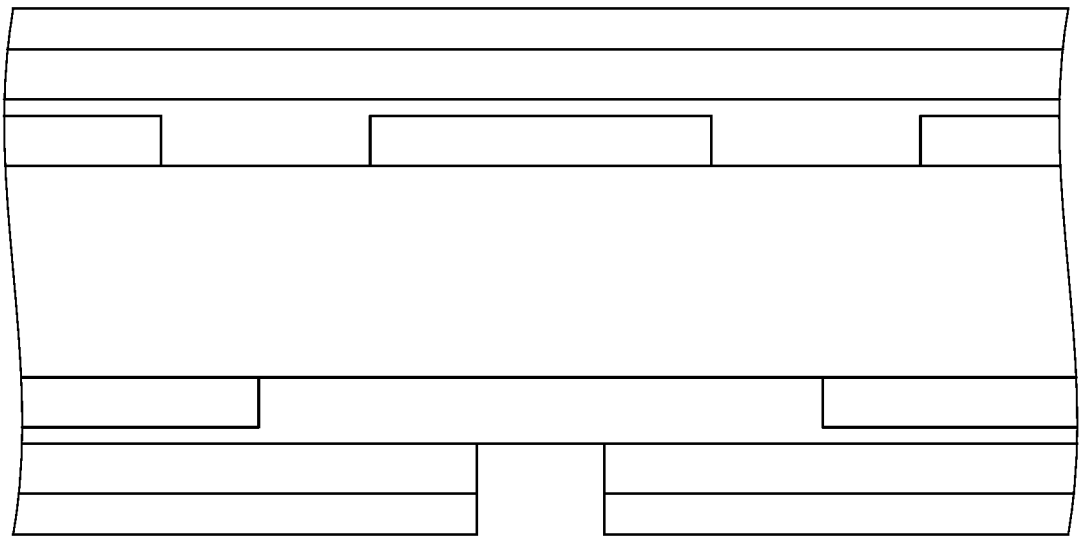

FIG. 5D illustrates that a portion of the conductive layer 21 is removed. The portion of the conductive layer 21 is substantially aligned with the removed portion of the dry film lamination 33.

Figure 5E:
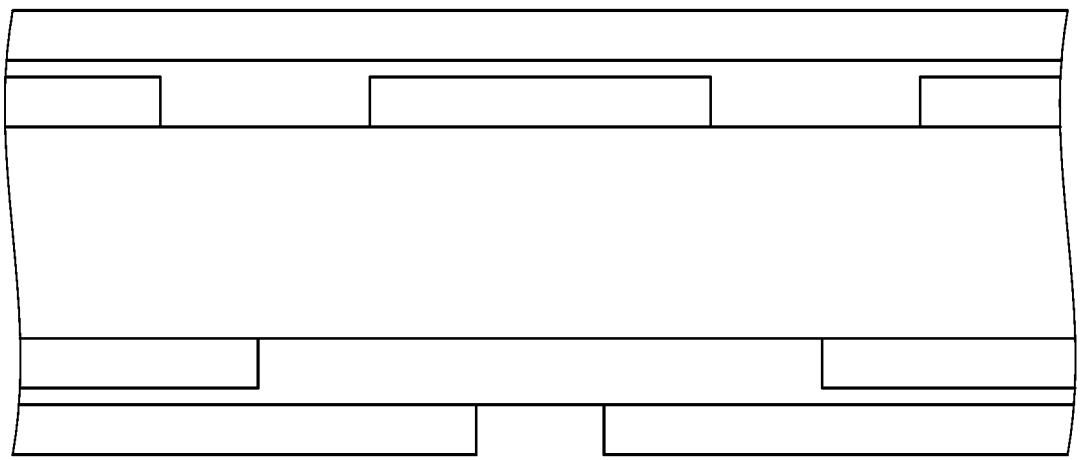

FIG. 5E illustrates removing the dry film lamination 33 from the structure as shown in FIG. 5D.

Figure 5F:
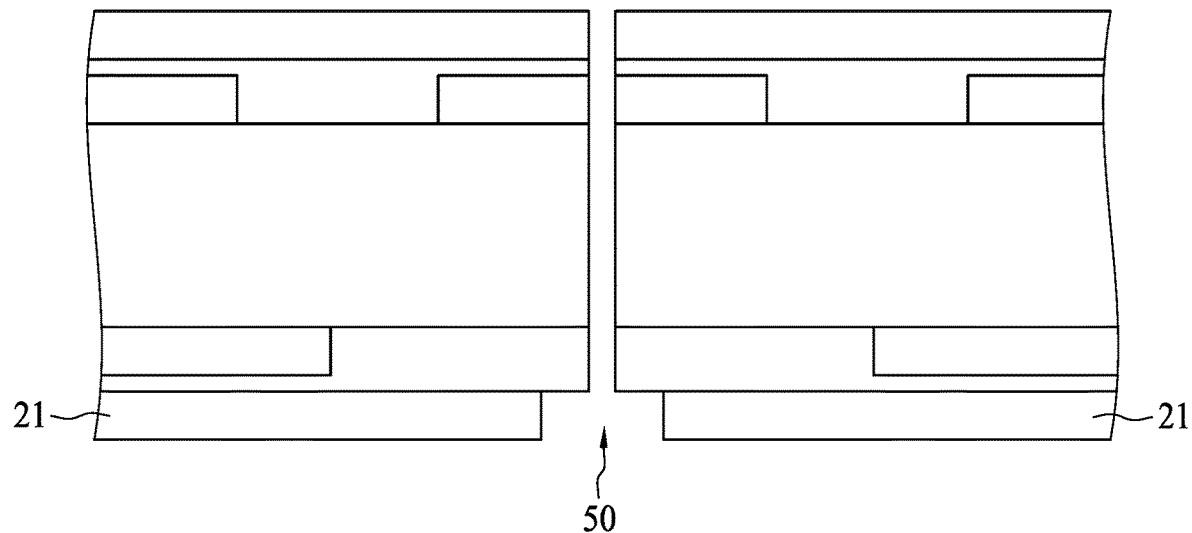

FIG. 5F illustrates separating the structure as shown in FIG. 5E. A driller drills the structure as shown in FIG. 5E. The burrs generated during the drilling are removed. The burrs are removed by etching with $KMnO_4$. A stamp hole 50 is formed between the lower conductive layer 21 in the structure as shown in FIG. 5E.

Figure 5G:
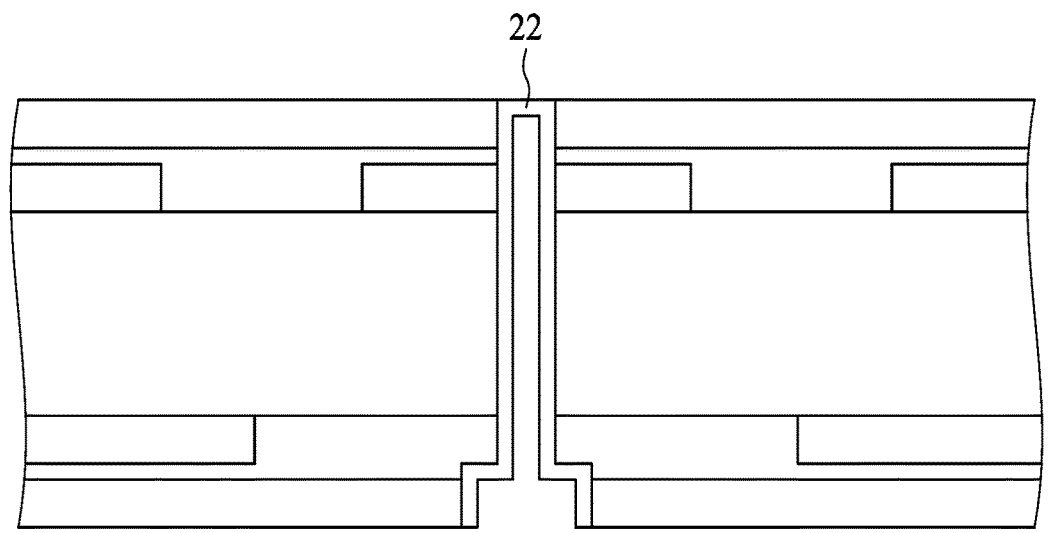

FIG. 5G illustrates disposing a conductive layer 22 in the space between the separated structures as shown in FIG. 5F. The conductive layer 22 is electroless plated.

Figure 5H:
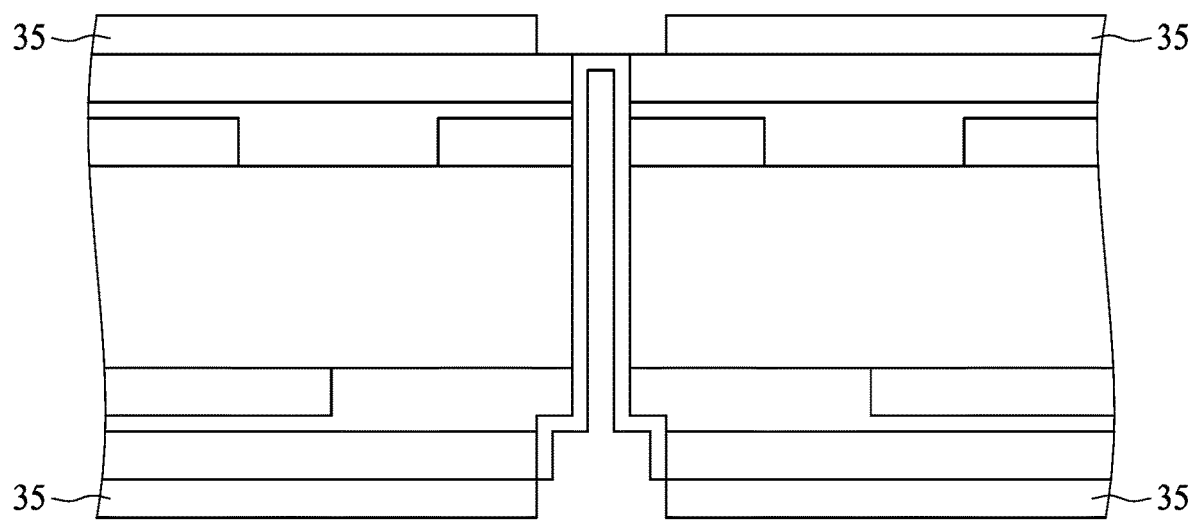

FIG. 5H illustrates disposing patterned solder resist 35 to sandwich the structure as shown in FIG. 5G.

After manufacturing the structure as shown in FIG. 5H, a barrier layer 23 is disposed on the conductive layer 22 to arrive at the structure as shown in FIG. 5. The barrier layer 23 includes nickel and gold. The barrier layer 23 is formed by electroless plating. Afterwards, the structure as shown in FIG. 5 is singulated to form a semiconductor device package.

Figure 6:
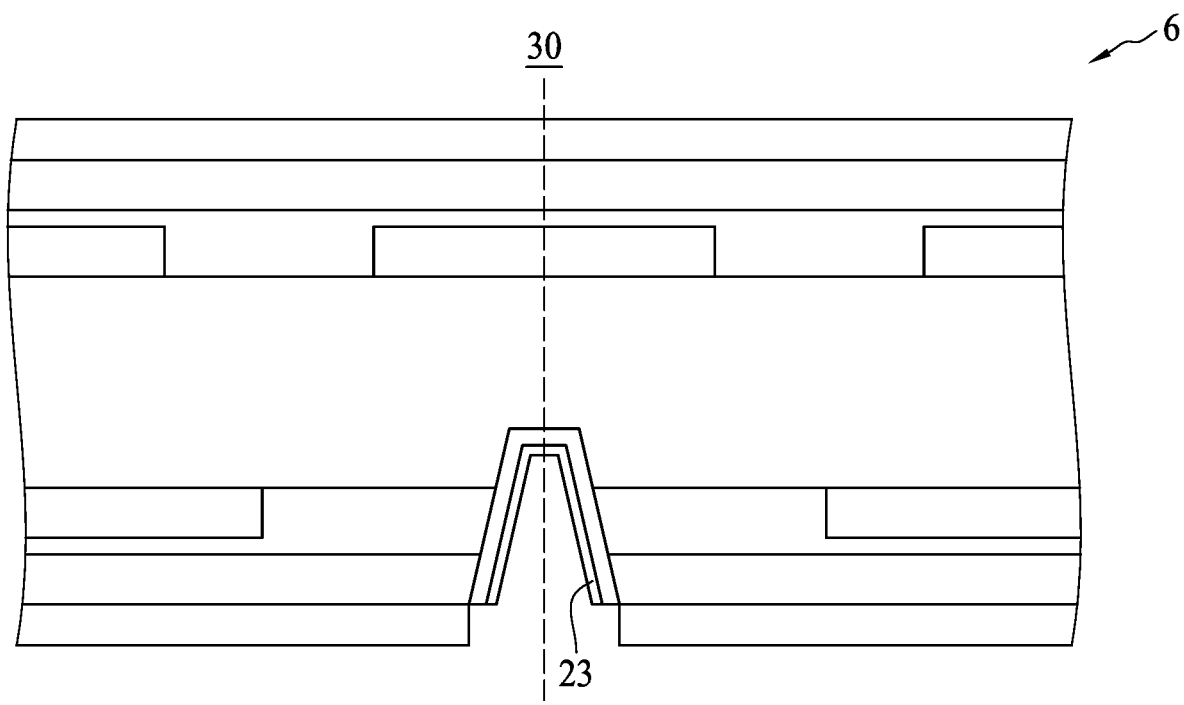
FIG. 6 illustrates a cross-sectional view of a panel or a strip of some semiconductor device packages according to some embodiments of the present disclosure.

FIG. 6 illustrates a cross-sectional view of a panel or a strip of some semiconductor device packages according to some embodiments of the present disclosure. A semiconductor substrate structure 6 is formed by the processes illustrated in FIG. 6A through FIG. 6H. The substrate structures as shown in FIG. 6 are electrically connected. Electrical tests can be applied to the substrate structures as shown in FIG. 6. After the electrical tests, the semiconductor substrate structures as shown in FIG. 6 are singulated by being cut on the scribe line 30.

Figure 6A:
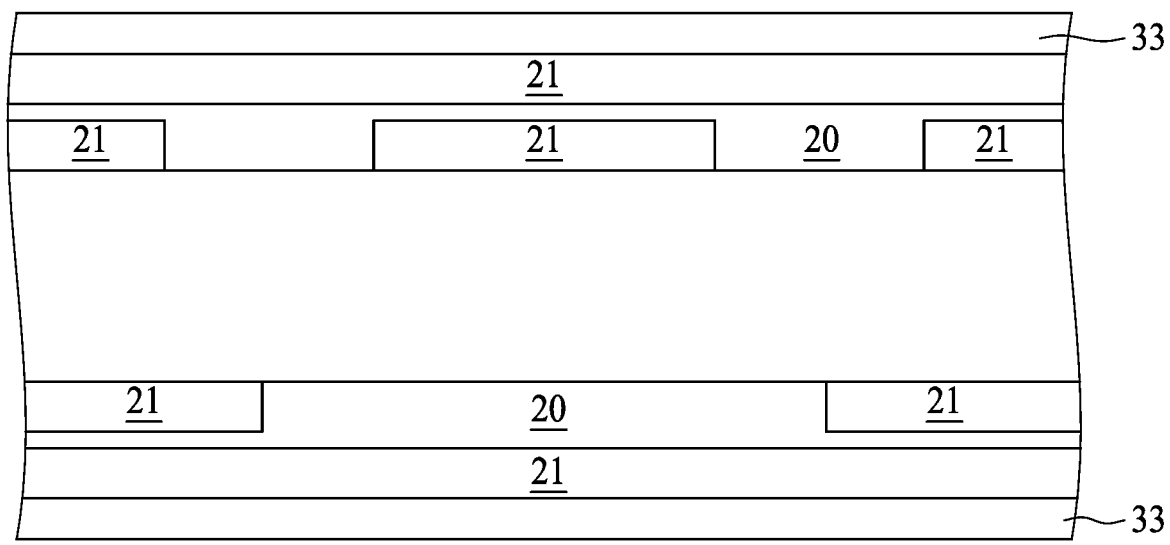
FIG. 6A, FIG. 6B, FIG. 6C, FIG. 6D, FIG. 6E, FIG. 6F, FIG. 6G and FIG. 6H illustrate a method of manufacturing a semiconductor device package as shown in FIG. 6.

FIG. 6A illustrates providing a semiconductor structure. The semiconductor structure includes a core layer 24. An upper patterned conductive layer 21 is disposed on the core layer 24. A lower patterned conductive layer 21 is disposed below the core layer 24. An upper passivation layer 20 is disposed on the upper patterned conductive layer 21. A lower passivation layer 20 is disposed below the lower patterned conductive layer 21. The upper patterned conductive layer 21 is disposed on the upper passivation layer 20. The lower patterned conductive layer 21 is disposed below the lower passivation layer 20. A dry film lamination 33 is disposed on the upper patterned conductive layer 21. A dry film lamination 33 is disposed below the lower patterned conductive layer 21.

Figure 6B:
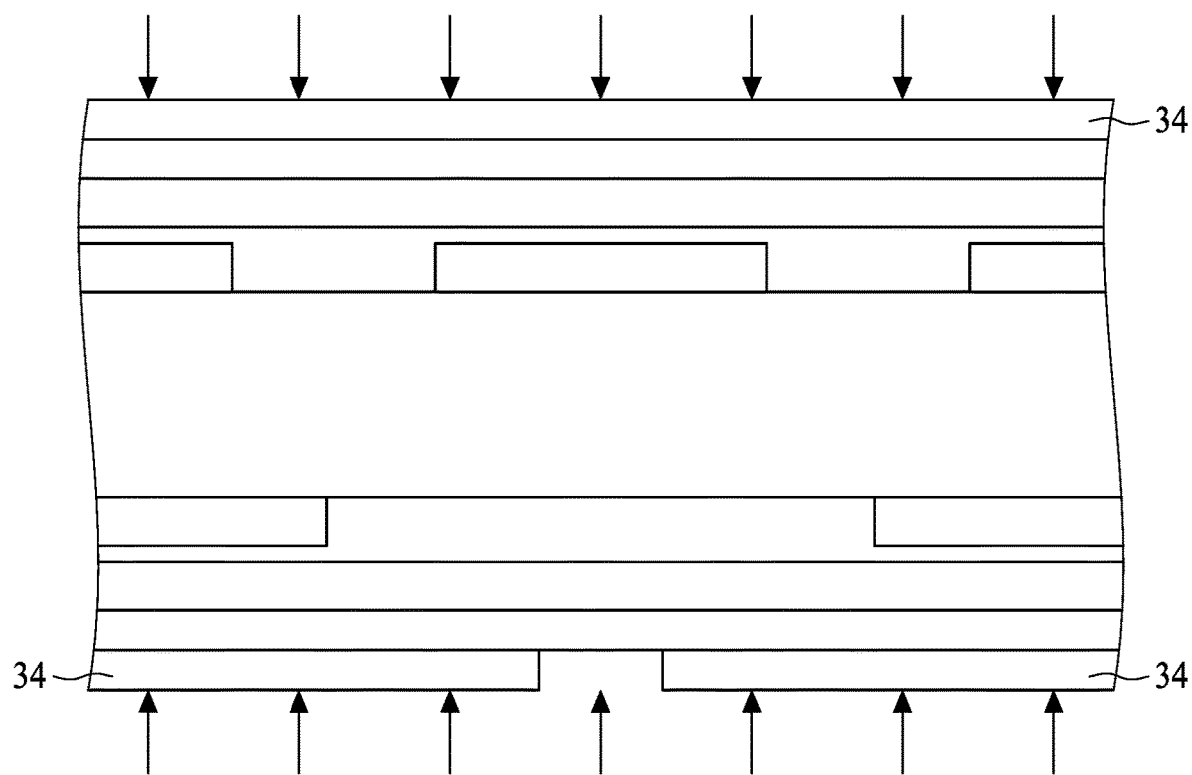

FIG. 6B illustrates that a patterned photoresist layer 34 is disposed to sandwich the structure as shown in FIG. 6A. Afterwards, the structure as shown in FIG. 6B is exposed to light of certain wavelengths.

Figure 6C:
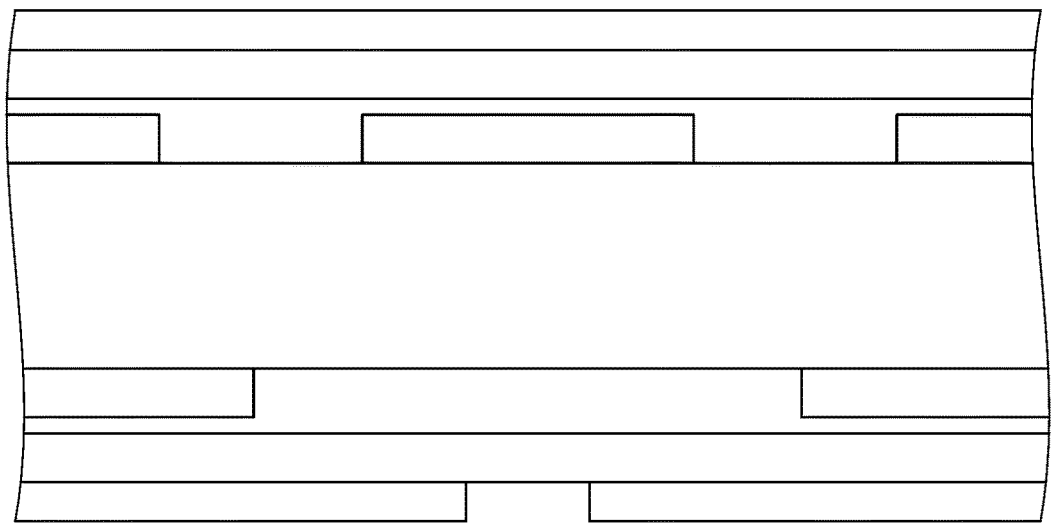

FIG. 6C illustrates that after exposing to light, a portion of the dry film lamination 33 is removed. Afterwards, the patterned photoresist layer 34 is also removed by etching.

Figure 6D:
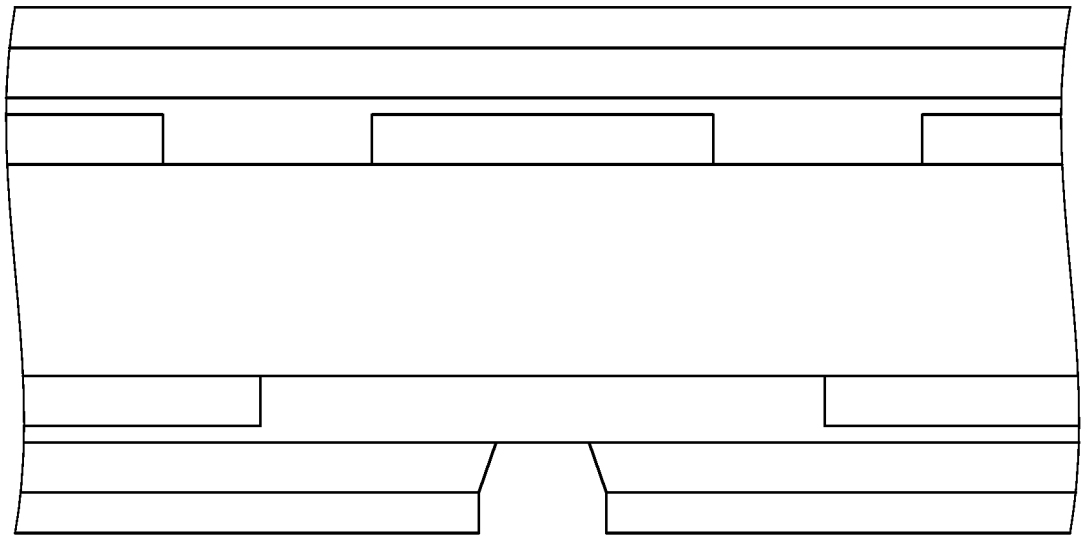

FIG. 6D illustrates that a portion of the conductive layer 21 is removed. The portion of the conductive layer 21 is removed by etching for more than one time. The portion of the conductive layer 21 is removed by being etched twice. The etching operations are similar to the processes as shown in FIG. 3F and FIG. 3G. The etching operations are similar to the processes as shown in FIG. 3F and FIG. 3J.

Figure 6E:
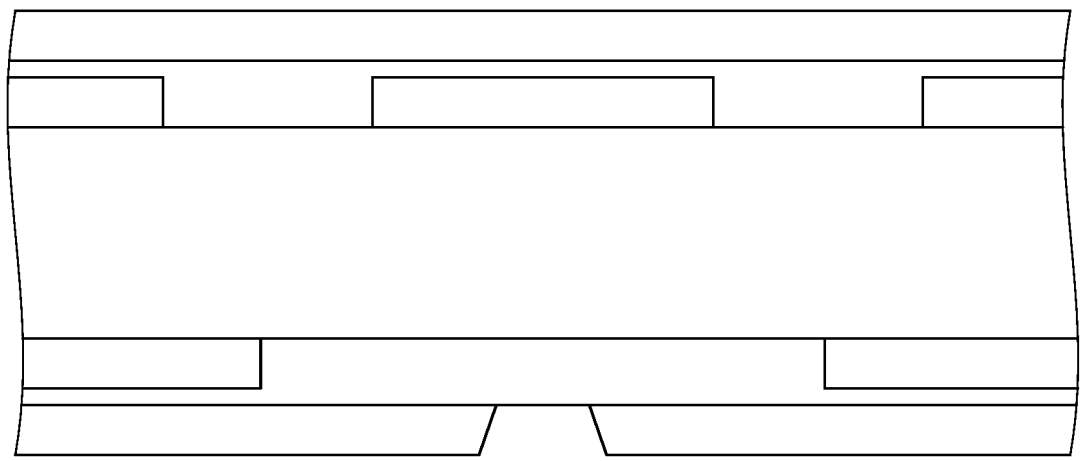

FIG. 6E illustrates removing the dry film lamination 33 from the structure as shown in FIG. 6D.

Figure 6F:
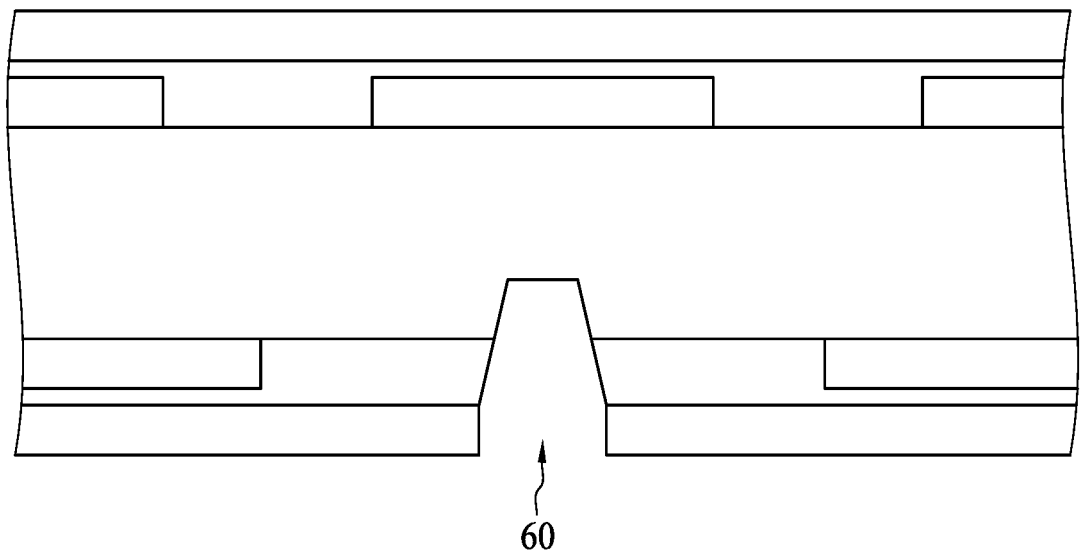

FIG. 6F illustrates removing a portion of the passivation layer 20 from the structure as shown in FIG. 6E. A laser is used to remove the portion of the passivation layer 20. A portion of the core layer 24 is also removed.

Figure 6G:
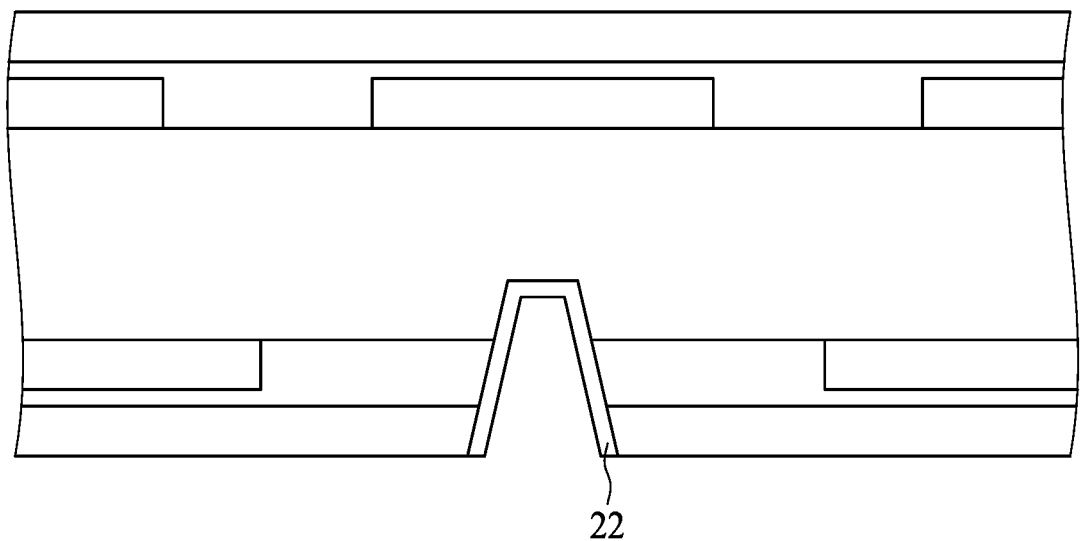

FIG. 6G illustrates disposing a conductive layer 22 in the stamp hole 60 as shown in FIG. 6F. The conductive layer 22 is electroless plated in the stamp hole.

Figure 6H:
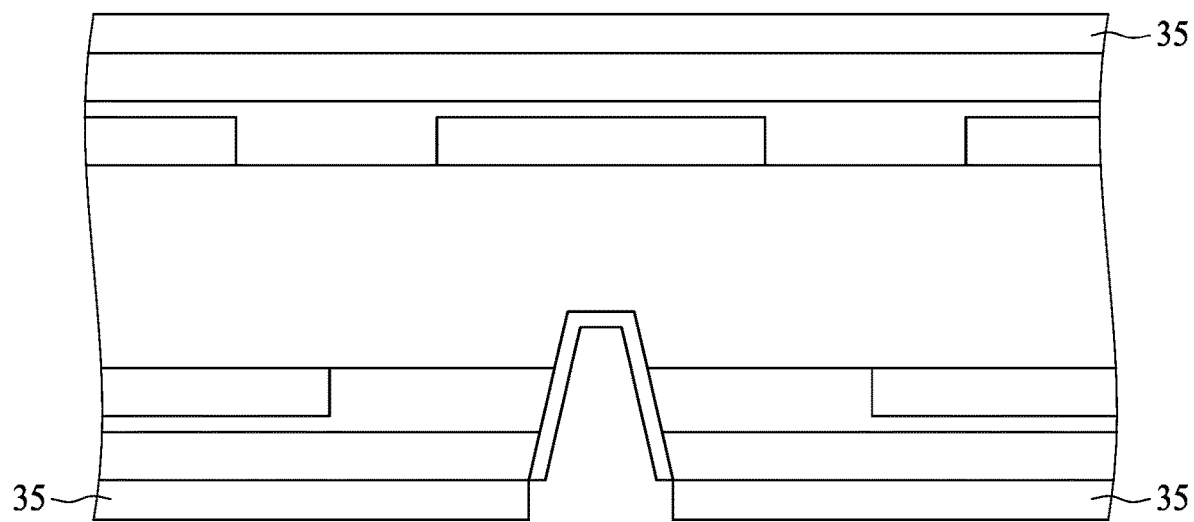

FIG. 6H illustrates disposing patterned solder resist 35 to sandwich the structure as shown in FIG. 6G.

After manufacturing the structure as shown in FIG. 6H, a barrier layer 23 is disposed on the conductive layer 22 to arrive at the structure as shown in FIG. 6. The barrier layer 23 includes nickel and gold. The barrier layer 23 is formed by electroless plating. Afterwards, the structure as shown in FIG. 6 is singulated to form a semiconductor device package.

Figure 7:
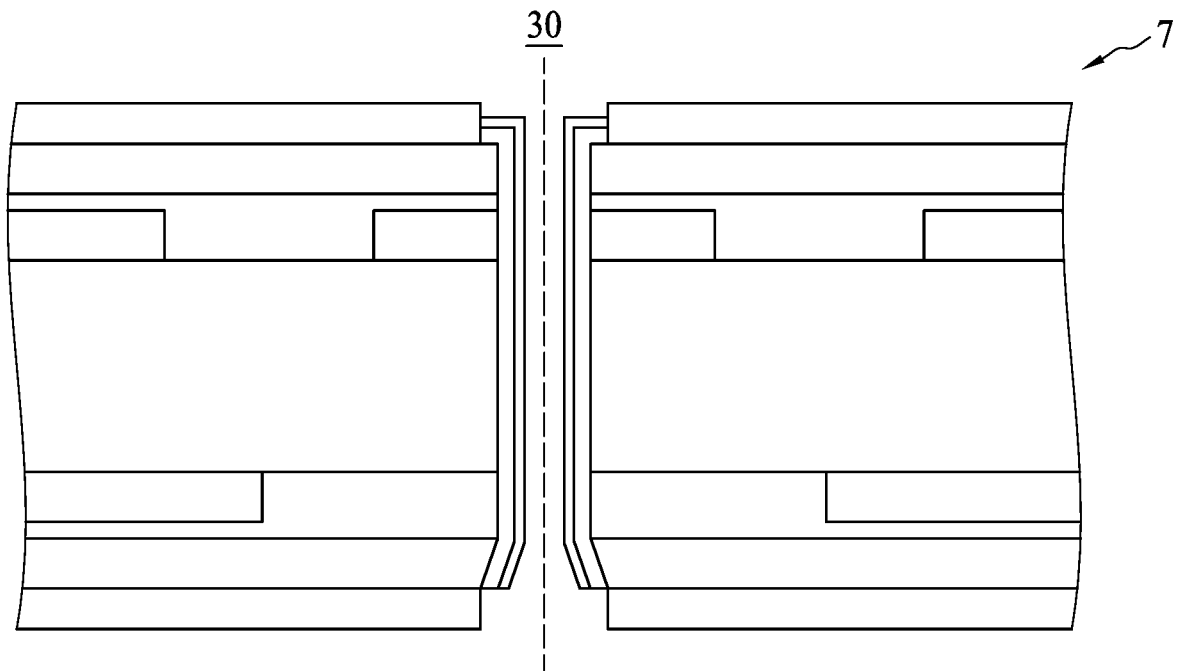
FIG. 7 illustrates a cross-sectional view of a panel or a strip of some semiconductor device packages according to some embodiments of the present disclosure.

FIG. 7 illustrates a cross-sectional view of a panel or a strip of some semiconductor device packages according to some embodiments of the present disclosure. A semiconductor substrate structure 7 is formed by the processes illustrated in FIG. 7A through FIG. 7H. The substrate structures as shown in FIG. 7 are electrically connected. Electrical tests can be applied to the substrate structures as shown in FIG. 7. After the electrical tests, the semiconductor substrate structures as shown in FIG. 7 are singulated by being cut on the scribe line 30.

Figure 7A:
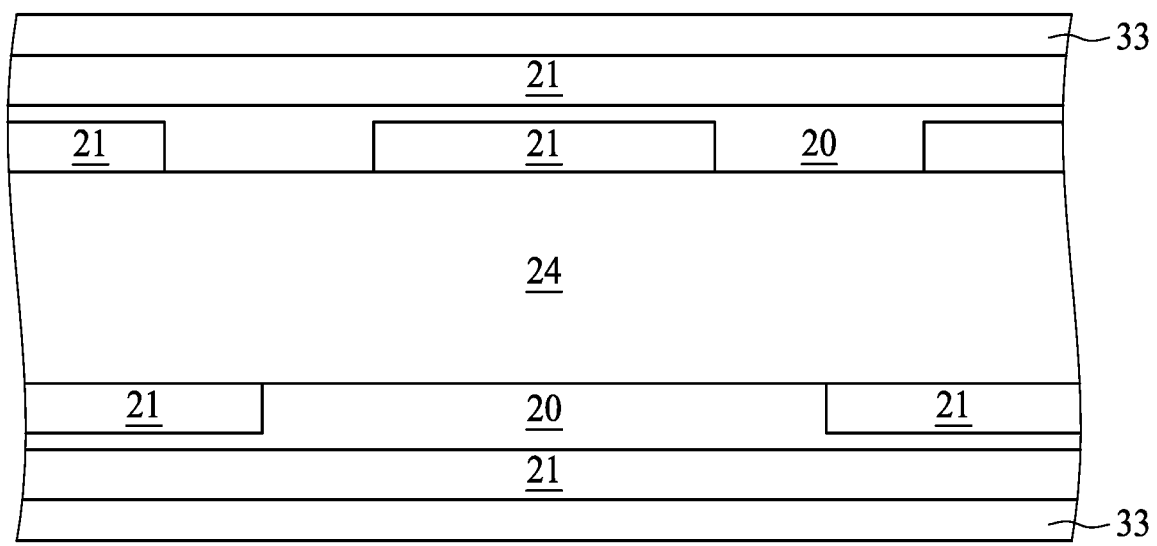
FIG. 7A, FIG. 7B, FIG. 7C, FIG. 7D, FIG. 7E, FIG. 7F, FIG. 7G and FIG. 7H illustrate a method of manufacturing a semiconductor device package as shown in FIG. 7.

FIG. 7A illustrates providing a semiconductor structure. The semiconductor structure includes a core layer 24. An upper patterned conductive layer 21 is disposed on the core layer 24. A lower patterned conductive layer 21 is disposed below the core layer 24. An upper passivation layer 20 is disposed on the upper patterned conductive layer 21. A lower passivation layer 20 is disposed below the lower patterned conductive layer 21. The upper patterned conductive layer 21 is disposed on the upper passivation layer 20. The lower patterned conductive layer 21 is disposed below the lower passivation layer 20. A dry film lamination 33 is disposed on the upper patterned conductive layer 21. A dry film lamination 33 is disposed below the lower patterned conductive layer 21.

Figure 7B:
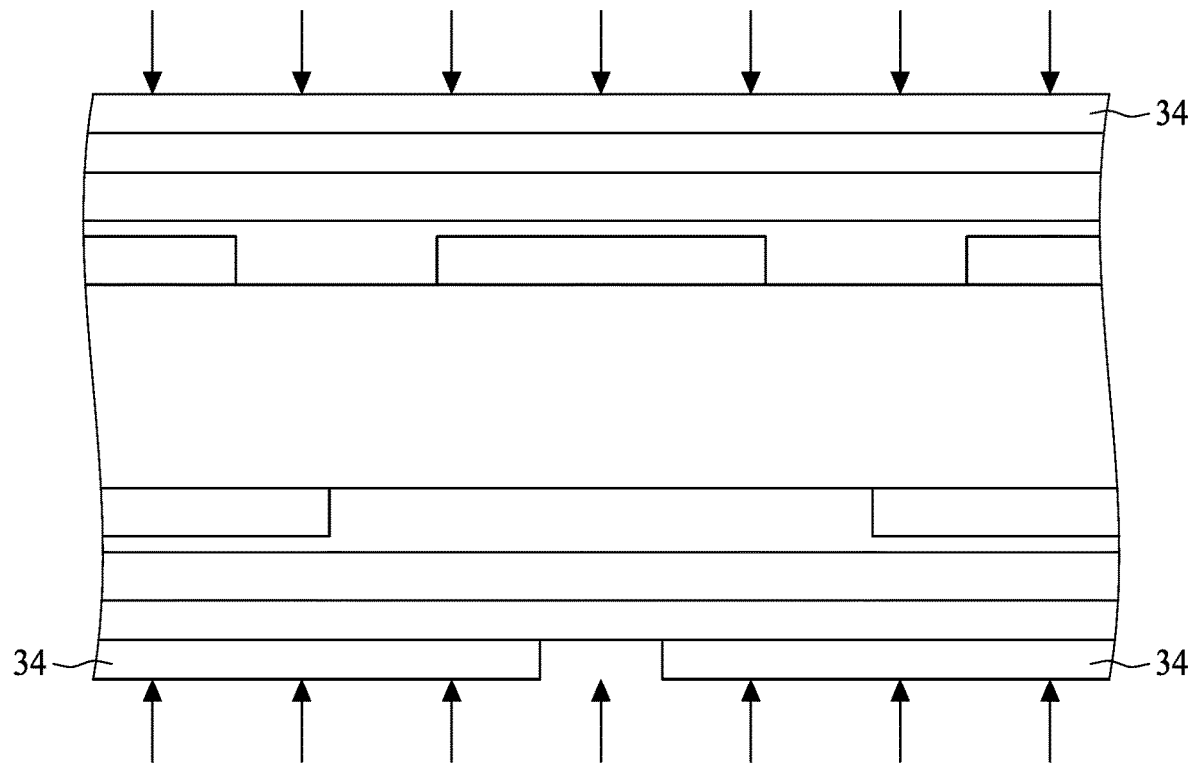

FIG. 7B illustrates that a patterned photoresist layer 34 is disposed to sandwich the structure as shown in FIG. 7A. Afterwards, the structure as shown in FIG. 7B is exposed to light of certain wavelengths.

Figure 7C:
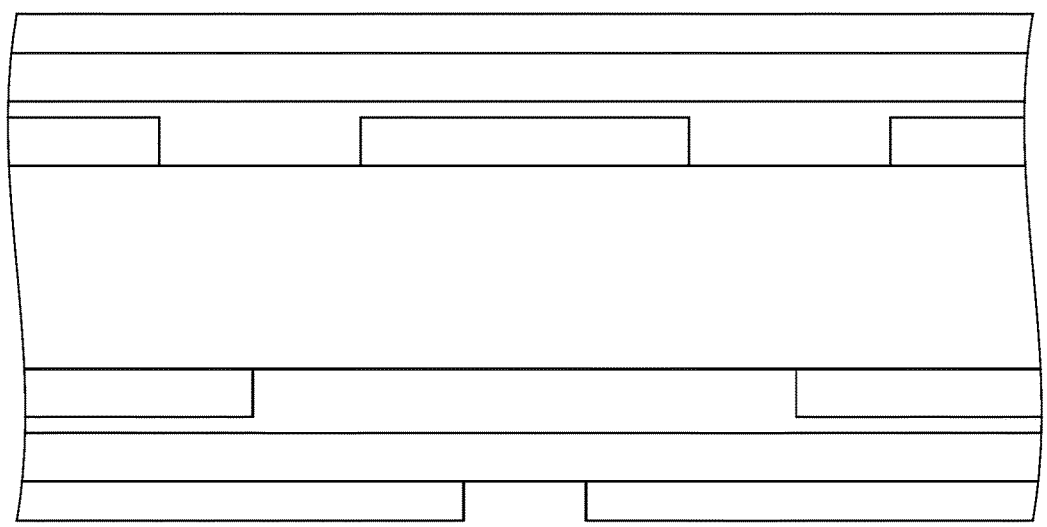

FIG. 7C illustrates that after exposing to light, a portion of the dry film lamination 33 is removed. Afterwards, the patterned photoresist layer 34 is also removed by etching.

Figure 7D:
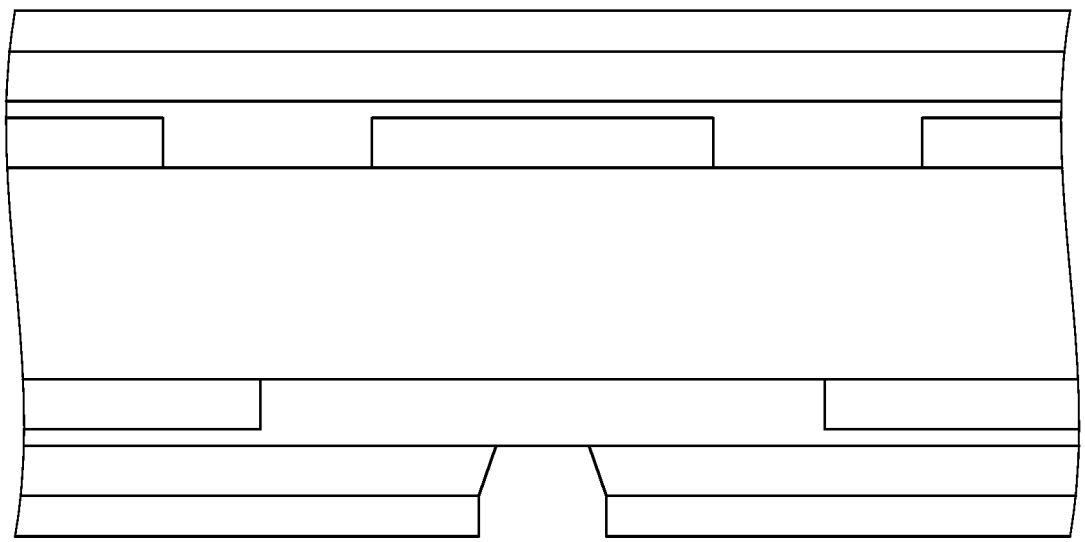

FIG. 7D illustrates that a portion of the conductive layer 21 is removed. The portion of the conductive layer 21 is removed by etching for more than one time. The portion of the conductive layer 21 is removed by being etched twice. The etching operations are similar to the processes as shown in FIG. 3F and FIG. 3G. The etching operations are similar to the processes as shown in FIG. 3F and FIG. 3J.

Figure 7E:
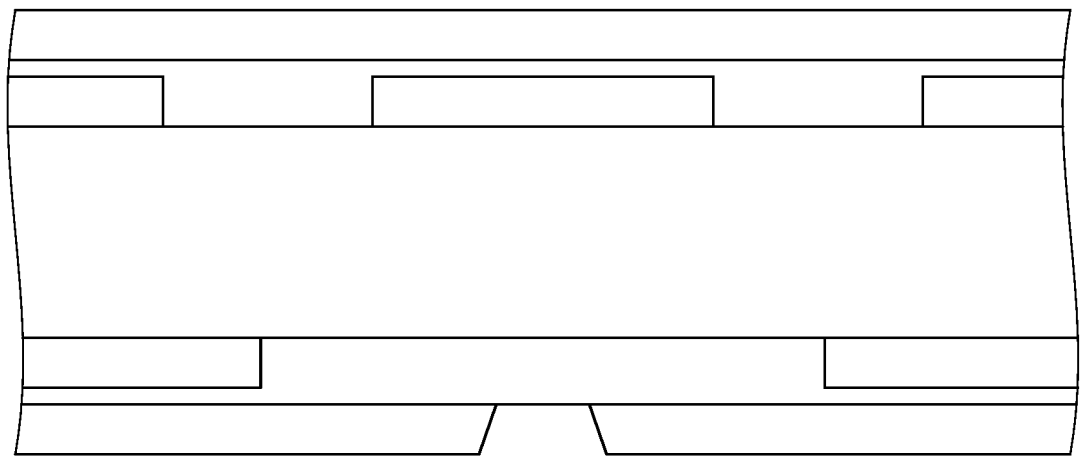

FIG. 7E illustrates removing the dry film lamination 33 from the structure as shown in FIG. 7D.

Figure 7F:
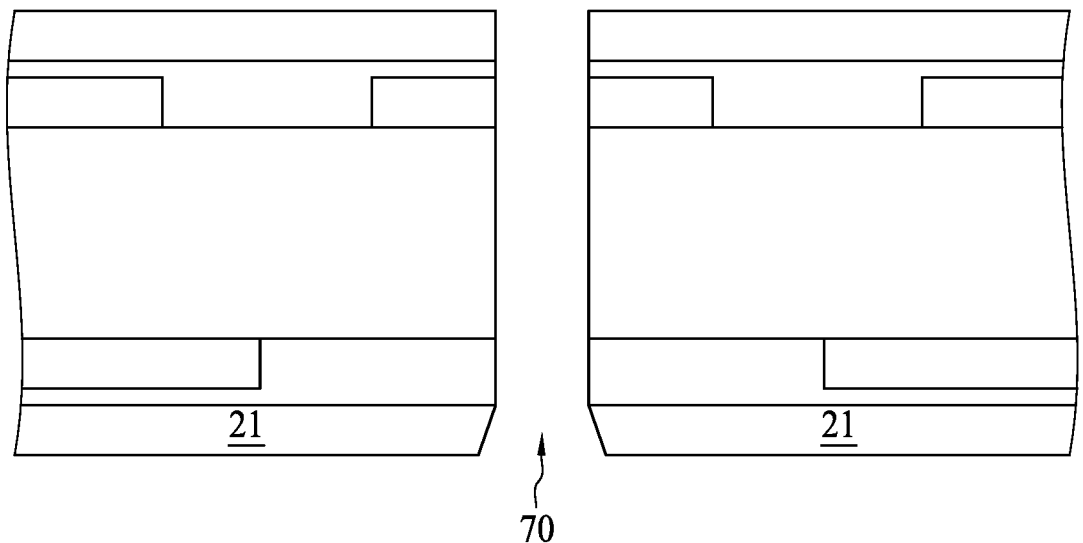

FIG. 7F illustrates separating the structure as shown in FIG. 7E. A driller drills the structure as shown in FIG. 7E. The burrs generated during the drilling are removed. The burrs are removed by etching with $KMnO_4$. A stamp hole 70 is formed between the lower conductive layer 21 in the structure as shown in FIG. 7E.

Figure 7G:
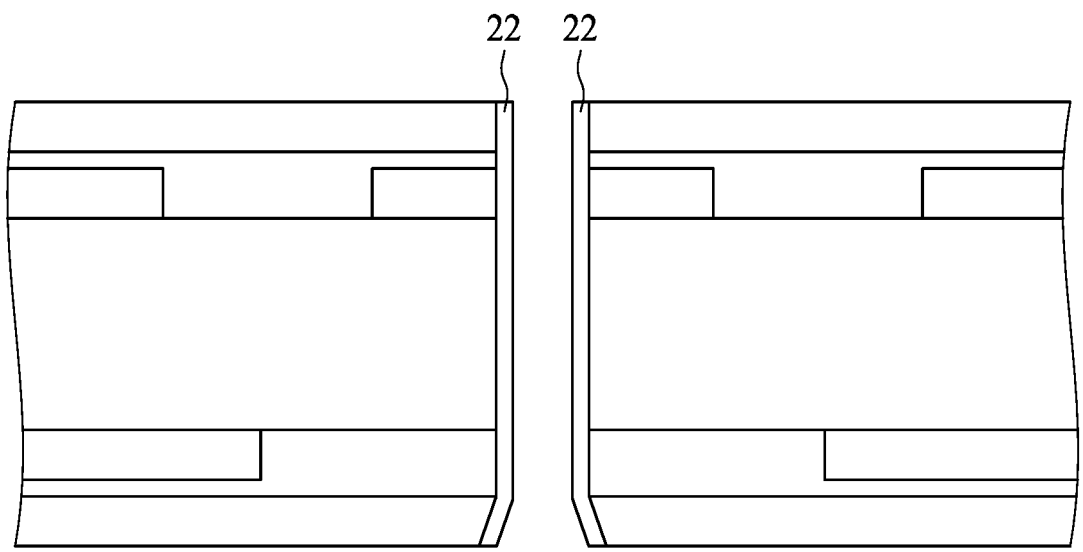

FIG. 7G illustrates disposing a conductive layer 22 in the space between the separated structures as shown in FIG. 7F. The conductive layer 22 is electroless plated.

Figure 7H:
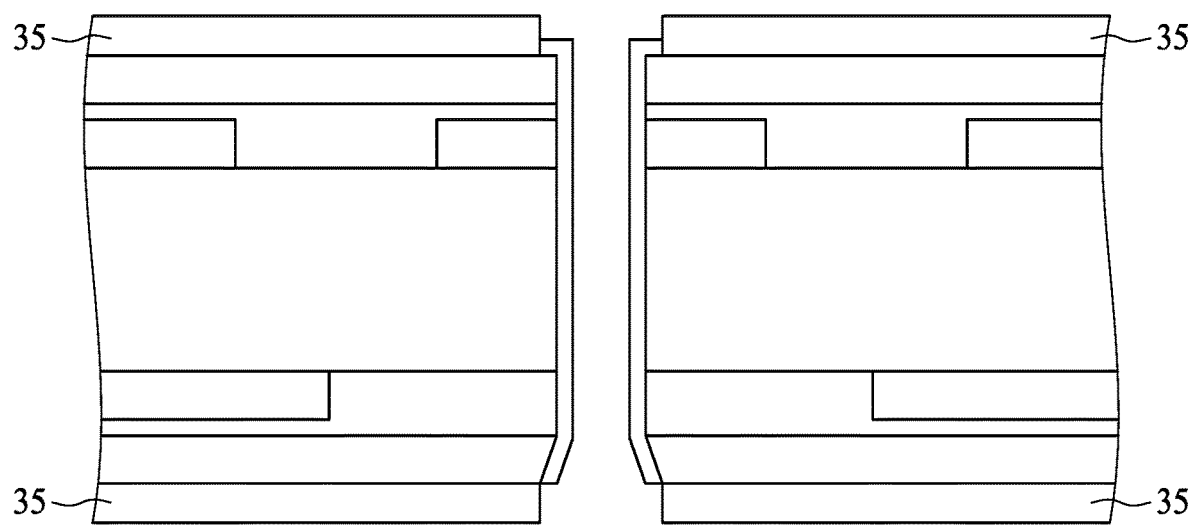

FIG. 7H illustrates disposing patterned solder resist 35 to sandwich the structure as shown in FIG. 7G.

After manufacturing the structure as shown in FIG. 7H, a barrier layer 23 is disposed on the conductive layer 22 to arrive at the structure as shown in FIG. 7. The barrier layer 23 includes nickel and gold. The barrier layer 23 is formed by electroless plating. Afterwards, the structure as shown in FIG. 7 is singulated to form a semiconductor device package.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic package, comprising:
   a substrate, comprising:
   a lateral sidewall;
   a bottom surface defining a recessed portion with the lateral sidewall, wherein the recessed portion is exposed to form the lateral sidewall;
   a first conductive layer disposed adjacent to the recessed portion; and
   a barrier layer disposed at least partially in the recessed portion, wherein the barrier layer includes a slant sidewall, and
   wherein the barrier layer includes a first horizontal sidewall and a vertical sidewall, and wherein the slant sidewall is between the first horizontal sidewall and the vertical sidewall.

2. The semiconductor device package of claim 1, wherein the slant sidewall has a slope different from that of the vertical sidewall.

3. The semiconductor device package of claim 1, wherein the barrier layer further includes a second horizontal sidewall.

4. The semiconductor device package of claim 1, wherein the first conductive layer includes a slant sidewall parallel to and in contact with the slant sidewall of the barrier layer.

5. The semiconductor device package of claim 1, wherein the vertical sidewall is between the slant sidewall and the first horizontal sidewall.

6. A semiconductor device package, comprising:
a substrate, comprising:
   a lateral sidewall;
   a bottom surface defining a recessed portion with the lateral sidewall, wherein the recessed portion includes a first inner wall and a second inner wall having a different slope and a different level form the first inner wall and wherein none of the first inner wall and the second inner wall is parallel with the bottom surface;
   a first conductive layer disposed adjacent to the recessed portion; and
   a barrier layer disposed at least partially in the recessed portion, wherein the barrier layer includes a first horizontal sidewall, a first sidewall conformal with the first inner wall and a second sidewall conformal with the second inner wall, wherein the first sidewall is located between the first horizontal sidewall and the second sidewall.

7. The semiconductor device package of claim 6, wherein the first sidewall is between the first horizontal sidewall and the second sidewall.

8. The semiconductor device package of claim 6, wherein the different slope of the first sidewall is greater than that of the second sidewall.

9. The semiconductor device package of claim 6, wherein the first sidewall is perpendicular to the first horizontal sidewall.

10. The semiconductor device package of claim 6, wherein the second sidewall is further connected to a second horizontal sidewall on the opposing side with respect to the first sidewall.

11. The semiconductor device package of claim 6, wherein a second horizontal sidewall is parallel to the first horizontal sidewall.

12. The semiconductor device package of claim 6, further comprising a second conductive layer between the first conductive layer and the barrier layer.

13. The semiconductor device package of claim 12, wherein the second conductive layer is conformal with the barrier layer.

14. An electronic assembly, comprising:
a substrate, comprising:
   a lateral sidewall;
   a bottom surface defining a recessed portion with the lateral sidewall, wherein the recessed portion is exposed to form the lateral sidewall;
   a first conductive layer disposed adjacent to the recessed portion;
   a barrier layer disposed at least partially in the recessed portion; and
a circuit board electrically connected to the first conductive layer via a solder, wherein the barrier layer disposed between the first conductive layer and the solder, and wherein the barrier layer includes a first horizontal sidewall, a first sidewall, and a second sidewall having a different slope from the first sidewall, wherein the first sidewall is between the first horizontal sidewall and the second sidewall.

15. The assembly structure of claim 14, wherein the barrier layer separates the first conductive layer and the solder.

16. An electronic assembly, comprising:
a substrate, comprising:
   a lateral sidewall;
   a bottom surface defining a recessed portion with the lateral sidewall, wherein the recessed portion is exposed to form the lateral sidewall;
   a first conductive layer disposed adjacent to the recessed portion;
   a barrier layer disposed at least partially in the recessed portion; and
a circuit board electrically connected to the first conductive layer via a solder, wherein the barrier layer disposed between the first conductive layer and the solder, and wherein the solder includes a first portion and a second portion, wherein the first portion is located in the recessed portion, and wherein the second portion covers a portion of the bottom surface.

17. The assembly structure of claim 16, wherein a lateral surface of the first portion of the solder is aligned with the lateral sidewall.

18. The assembly structure of claim 17, wherein a side surface of the second portion of the solder protrudes from a side surface of the first portion of the solder.

* * * * *